(12) United States Patent
Yoshihara et al.

(10) Patent No.: US 10,408,981 B2
(45) Date of Patent: Sep. 10, 2019

(54) NEAR-INFRARED CUT FILTER

(71) Applicant: AGC Inc., Tokyo (JP)

(72) Inventors: Akihiko Yoshihara, Tokyo (JP); Takaaki Murakami, Tokyo (JP)

(73) Assignee: AGC Inc., Tokyo (JP)

( * ) Notice: Subject to any disclaimer, the term of this patent is extended or adjusted under 35 U.S.C. 154(b) by 645 days.

(21) Appl. No.: 14/722,792

(22) Filed: May 27, 2015

(65) Prior Publication Data

US 2015/0260888 A1    Sep. 17, 2015

Related U.S. Application Data

(63) Continuation of application No. PCT/JP2013/081639, filed on Nov. 25, 2013.

(30) Foreign Application Priority Data

Nov. 30, 2012    (JP) ................. 2012-263536

(51) Int. Cl.
*G02B 5/28* (2006.01)
*G02B 5/26* (2006.01)
(Continued)

(52) U.S. Cl.
CPC ............... *G02B 5/282* (2013.01); *G02B 5/26* (2013.01); *G03B 11/00* (2013.01); *H01L 31/02165* (2013.01); *H01L 27/14621* (2013.01)

(58) Field of Classification Search
CPC . G02B 1/10; G02B 1/105; G02B 1/11; G02B 1/111; G02B 1/113; G02B 1/115;
(Continued)

(56) References Cited

U.S. PATENT DOCUMENTS

2005/0180010 A1* 8/2005 Mukaiyama .......... G02B 5/282
359/487.04
2005/0265150 A1    12/2005 Hirayama et al.
(Continued)

FOREIGN PATENT DOCUMENTS

CN    1657980 A    8/2005
CN    1979230       6/2007
(Continued)

OTHER PUBLICATIONS

International Search Report issued in International Application No. PCT/JP2013/081639 dated Feb. 25, 2014 with English Translation.
(Continued)

*Primary Examiner* — Thong Q Nguyen
(74) *Attorney, Agent, or Firm* — Oblon, McClelland, Maier & Neustadt, L.L.P.

(57) ABSTRACT

A near-infrared cut filter has a transparent substrate and an optical multilayer film formed on the transparent substrate and including high-refractive index films each having a refractive index at a wavelength of 500 nm in a range of 2.0 to 2.8 and low-refractive index films each having a refractive index at the wavelength of 500 nm of less than 1.6. The multilayer film is formed such that the high-refractive and low-refractive index films are alternately stacked and that the filter has spectral transmittance characteristic for the entire wavelength range of 450 nm to less than 550 nm and part of that wavelength range for incident light having incident angle of 0 degree, and part of wavelength range of 450 nm to less than 550 nm and the entire wavelength range of 450 nm to less than 550 nm for incident light having incident angle of 40 degrees.

16 Claims, 30 Drawing Sheets

(51) Int. Cl.
  *G03B 11/00* (2006.01)
  *H01L 31/0216* (2014.01)
  *H01L 27/146* (2006.01)
(58) Field of Classification Search
  CPC .......... G02B 5/003; G02B 5/20; G02B 5/208;
        G02B 5/22; G02B 5/223; G02B 5/28;
        G02B 5/281; G02B 5/282; G02B 5/283;
        G02B 5/26
  See application file for complete search history.

(56) References Cited

U.S. PATENT DOCUMENTS

| | | | |
|---|---|---|---|
| 2006/0291061 A1* | 12/2006 | Iyama | G02B 5/282 |
| | | | 359/614 |
| 2007/0127126 A1 | 6/2007 | Terada | |
| 2009/0050946 A1 | 2/2009 | Duparre et al. | |
| 2010/0025789 A1 | 2/2010 | Imai et al. | |
| 2010/0188737 A1 | 7/2010 | Terada | |
| 2013/0094075 A1* | 4/2013 | Saitoh | G02B 5/0833 |
| | | | 359/350 |
| 2014/0091419 A1* | 4/2014 | Hasegawa | G02B 13/004 |
| | | | 257/432 |

FOREIGN PATENT DOCUMENTS

| | | |
|---|---|---|
| EP | 2063629 | 5/2009 |
| JP | 2006-012371 | 1/2006 |
| JP | 2007-183525 | 7/2007 |
| JP | 2008-508545 | 3/2008 |
| JP | 2008-92532 | 4/2008 |
| JP | 2008-139693 | 6/2008 |
| JP | 2008-158036 | 7/2008 |
| JP | 2013-156460 | 8/2013 |
| JP | 2013-178338 | 9/2013 |
| WO | 2006/010622 | 2/2006 |
| WO | 2008/041739 | 4/2008 |
| WO | 2013/042738 | 3/2013 |
| WO | 2013/183557 | 12/2013 |
| WO | 2014/084167 | 6/2014 |

OTHER PUBLICATIONS

International Preliminary Report on Patentability and Written Opinion dated Jun. 11, 2015 in PCT/JP2013/081639.

* cited by examiner

NEAR-INFRARED CUT FILTER

CROSS-REFERENCE TO RELATED APPLICATIONS

This application is a continuation of prior International Application No. PCT/JP2013/081639 filed on Nov. 25, 2013 which is based upon and claims the benefit of priority from Japanese Patent Application No. 2012-263536 filed on Nov. 30, 2012; the entire contents of all of which are incorporated herein by reference.

FIELD

The present invention relates to a near-infrared cut filter.

BACKGROUND

For optical apparatuses such as a digital camera and a digital video, solid-state image sensing device such as a Charge Coupled Device (CCD) image sensor and a Complementary Metal Oxide Semiconductor (CMOS) image sensor are used. However, spectral characteristics of the solid-state image sensing devices have high sensitivities with respect to infrared light as compared to human visibility characteristics. Hence, spectral correction by a near-infrared cut filter is performed in the optical apparatus having the solid-state image sensing device.

As the near-infrared cut filter, for example, a near-infrared absorption type color glass filter such as fluorophosphate-based glass containing $Cu^{2+}$ ions as a coloring component, a multilayer film filter in which an optical multilayer film for blocking near-infrared light and ultraviolet light is provided on a transparent base material, and further a filter combined with them have been used.

The optical multilayer film is required to cause no phenomenon of decreasing in transmittance (ripple) in a transmission band at 400 nm to 700 nm that the solid-state image sensing device requires. Conventionally, there has been known a technique of suppressing occurrence of a ripple in the optical multilayer film (see, for example, Patent References 1 (JP-B 4672101) and 2 (JP-A 2008-139693)).

DISCLOSURE OF THE INVENTION

However, even if the occurrence of a ripple can be suppressed when an incident angle of light is a specific incident angle, a ripple sometimes occurs when the incident angle of light is changed. The conventional techniques do not consider the ripple to occur due to a change in the incident angle, and particularly do not consider a large ripple to occur when the incident angle becomes 40 degrees or more.

In recent years, with reductions in size and thickness of the optical apparatuses such as a digital camera and a digital video, the lens of the optical apparatuses is increasingly made to have a wider angle. Therefore, light in a state of further tilted is made incident on the solid-state image sensing device. For example, the incident angle that has been so far 30 degrees or so results in an incident angle exceeding 30 degrees in recent years.

Further, the near-infrared cut filter is sometimes disposed at the position of an optical apparatus, where it can be visually recognized externally. For example, in a portable electronic apparatus such as a mobile phone or a smartphone, a cover glass of an imaging device is sometimes disposed at the position where it can be visually recognized externally. Then, such a cover glass is sometimes regarded as a near-infrared cut filter. In such a case, in terms of improving the appearance of the optical apparatus, a predetermined reflected color is required to be maintained without reflected colors being changed largely depending on the incident angle of light.

An embodiment of the present invention has been made in consideration of the above-described problems, and its object is to provide a near-infrared cut filter in which excessive occurrence of a ripple and excessive change in reflected color are suppressed regardless of an incident angle of light.

A near-infrared cut filter of an embodiment includes a transparent substrate and an optical multilayer film provided on the transparent substrate. The optical multilayer film has a structure in which a high-refractive index film having a refractive index at a wavelength of 500 nm of 2.0 or more and a low-refractive index film having a refractive index at the wavelength of 500 nm of less than 1.6 are stacked alternately. Further, the near-infrared cut filter of the embodiment has the following spectral transmittance characteristics according to an incident angle of light.

When the incident angle of light is 0 degree, at least a part of a wavelength range of 450 nm or more to less than 550 nm has a portion in which the difference obtained by subtracting a transmittance from a mean transmittance of a wavelength range of 450 nm to 700 nm becomes 1.65% or more.

When the incident angle of light is 40 degrees, at least a part of the wavelength range of 450 nm or more to less than 550 nm has a portion in which the difference obtained by subtracting a transmittance from a mean transmittance of the wavelength range of 450 nm to 700 nm becomes 3.5% or more. Further, when the incident angle of light is 40 degrees, in the entire region of the wavelength range of 450 nm or more to less than 550 nm, the difference obtained by subtracting the transmittance from the mean transmittance of the wavelength range of 450 nm to 700 nm is 7.0% or less.

According to the near-infrared cut filter of the embodiment, it is possible to suppress excessive occurrence of a ripple and excessive change in reflected color regardless of an incident angle of light.

DETAILED DESCRIPTION

Hereinafter, there will be explained an embodiment of a near-infrared cut filter.

Figure 1:
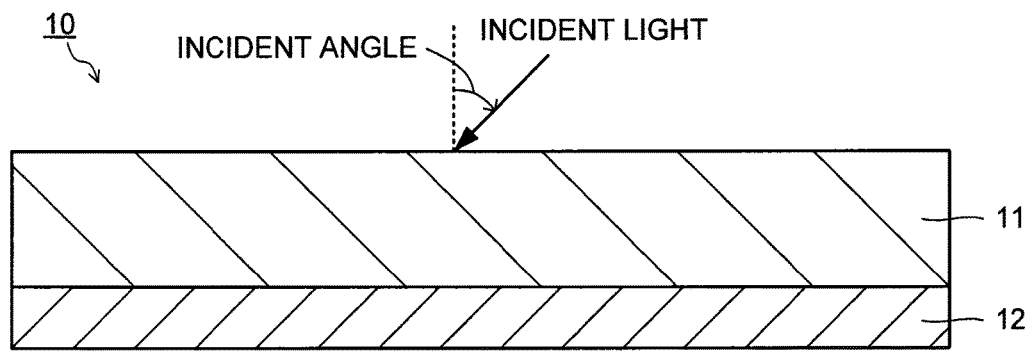
FIG. 1 is a cross-sectional view illustrating one embodiment of a near-infrared cut filter.

FIG. 1 is a cross-sectional view illustrating one embodiment of a near-infrared cut filter 10. The near-infrared cut filter 10 includes a transparent substrate 11 and an optical multilayer film 12 provided on the transparent substrate 11.

The transparent substrate 11 is not particularly limited as long as it can transmit light in a visible wavelength region. As the material of the transparent substrate 11, there can be cited, for example, glass; crystals such as crystalline quartz, lithium niobate, and sapphire; polyester resins such as polyethylene terephthalate (PET) and polybutylene terephthalate (PBT); polyolefin resins such as polyethylene, polypropylene, and ethylene-vinyl acetate copolymer; acrylic resins such as a norbornene resin, polyacrylate, and polymethyl methacrylate; a urethane resin, a vinyl chloride resin, a fluorocarbon resin, a polycarbonate resin, a polyvinyl butyral resin, a polyvinyl alcohol resin and so on. The refractive index of the transparent substrate 11 at a wavelength of 500 nm is preferably 1.46 or more, and more preferably 1.5 or more. Further, the refractive index of the transparent substrate 11 at the wavelength of 500 nm is preferably 1.8 or less, and more preferably 1.6 or less.

For the transparent substrate 11, one that absorbs light in a near-infrared wavelength region can be used. An image quality close to human visibility characteristics can be obtained by using the transparent substrate 11 that absorbs the light in the near-infrared wavelength region. As the transparent substrate 11 that absorbs the light in the near-infrared wavelength region, for example, absorption-type glass made by adding $Cu^{2+}$ (ion) to fluorophosphate-based glass or phosphate-based glass can be cited. Further, one made by adding an absorbent that absorbs the near-infrared light into a resin material may be used. As the absorbent, for example, dye, pigment, and a metal complex-based compound can be cited, and specifically a phthalocyanine-based compound, a naphthalocyanine-based compound, and a dithiol metal complex-based compound can be cited.

Figure 2:
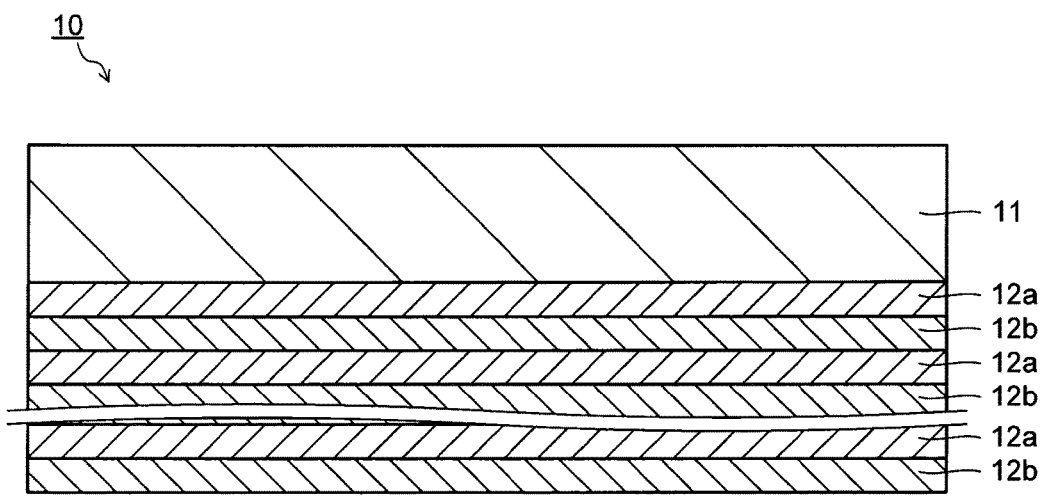
FIG. 2 is a partial cross-sectional view illustrating one embodiment of an optical multilayer film.

The optical multilayer film 12 has, as illustrated in FIG. 2, for example, a structure in which a high-refractive index film 12a having a refractive index at the wavelength of 500 nm of 2.0 or more and a low-refractive index film 12b having a refractive index at the wavelength of 500 nm of less than 1.6 are stacked alternately. The optical multilayer film 12 is preferably provided only on one of the principal surfaces of the transparent substrate 11, but may also be dividedly provided on both of the principal surfaces of the transparent substrate 11.

The optical multilayer film 12 is constituted so that spectral transmittance characteristics of the near-infrared cut filter 10 satisfy the following characteristics according to an incident angle of light. Incidentally, the incident angle of light when light is incident vertically to a light transmission surface of the near-infrared cut filter 10 is set to 0 degree.

When the incident angle of light is 0 degree, (which is vertical incidence), at least a part of a wavelength range of 450 nm or more to less than 550 nm has a portion in which the difference $(T_1-T_2)$ obtained by subtracting a transmittance $T_2$ from a mean transmittance $T_1$ of a wavelength range of 450 nm to 700 nm becomes 1.65% or more.

When the incident angle of light is 40 degrees, at least a part of the wavelength range of 450 nm or more to less than 550 nm has a portion in which the difference $(T_3-T_4)$ obtained by subtracting a transmittance $T_4$ from a mean transmittance $T_3$ of the wavelength range of 450 nm to 700 nm becomes 3.5% or more. Further, when the incident angle of light is 40 degrees, in the entire region of the wavelength range of 450 nm or more to less than 550 nm, the difference $(T_3-T_4)$ obtained by subtracting the transmittance $T_4$ from the mean transmittance $T_3$ of the wavelength range of 450 nm to 700 nm is 7.0% or less.

A conventional near-infrared cut filter mainly suppresses occurrence of a ripple when the incident angle of light is small. When the incident angle of light is 0 degree, for example, in the entire region of the wavelength range of 450 nm or more to less than 550 nm, which is a part of a transmission band, the difference $(T_1-T_2)$ obtained by subtracting the transmittance $T_2$ from the mean transmittance $T_1$ of the wavelength range of 450 nm to 700 nm is designed to be less than 1.65%. On the other hand, in the conventional near-infrared cut filter, occurrence of a ripple when the incident angle of light is large is not suppressed. When the incident angle of light is 40 degrees, for example, a large ripple such that the difference $(T_3-T_4)$ obtained by subtracting the transmittance $T_4$ of the ripple part from the mean transmittance $T_3$ of the wavelength range of 450 nm to 700 nm exceeds 7.0% occurs in the wavelength range of 450 nm or more to less than 550 nm.

In the near-infrared cut filter 10 of this embodiment, a specific spectral transmittance characteristic is set, thereby making it possible to suppress excessive occurrence of a ripple and excessive change in reflected color regardless of the incident angle of light. Specifically, it is constituted to have a certain-sized ripple in a specific wavelength range when the incident angle of light is small and to have a certain-sized ripple in a specific wavelength range when the incident angle of light is large, and thereby it is possible to suppress excessive occurrence of a ripple and excessive change in reflected color regardless of the incident angle of light.

Hereinafter, the spectral transmittance characteristics of the near-infrared cut filter 10 will be explained specifically.

First, the spectral transmittance characteristics when the incident angle of light is 0 degree will be explained. The spectral transmittance characteristic has a transmission band such that the mean transmittance $T_1$ becomes 85% or more in the wavelength range of 450 nm to 700 nm, for example. Normally, on the ultraviolet side of the transmission band, an ultraviolet-side shield band is formed, and on the infrared side of the transmission band, an infrared-side shield band is formed. The mean transmittance $T_1$ of the wavelength range of 450 nm to 700 nm is preferably 87% or more, and more preferably 89% or more.

It is sufficient when the portion in which the difference $(T_1-T_2)$ obtained by subtracting the transmittance $T_2$ from the mean transmittance $T_1$ of the wavelength range of 450 nm to 700 nm becomes 1.65% or more exists in the wavelength range of 450 nm or more to less than 550 nm, but the above portion preferably exists in a wavelength range of 500 nm or more to less than 550 nm. Note in this description, $T_1$ is the mean transmittance of the wavelength range of 450 nm to 700 nm when the incident angle of light is 0 degree, and $T_2$ is any transmittance in the wavelength range of 450 nm or more to less than 550 nm when the incident angle of light is 0 degree. Hereinafter, the difference $(T_1-T_2)$ obtained by subtracting the transmittance $T_2$ from the mean transmittance $T_1$ of the wavelength range of 450 nm to 700 nm will be described as a "transmittance difference $(T_1-T_2)$" simply. Further, the mean transmittance $T_1$ of the wavelength range of 450 nm to 700 nm will be described as a "mean transmittance $T_1$" simply.

Out of the portion in which the transmittance difference $(T_1-T_2)$ becomes 1.65% or more, a portion having the largest transmittance difference $(T_1-T_2)$, namely a portion having the smallest transmittance $T_7$ out of the transmittance $T_2$ preferably exists in the wavelength range of 500 nm or more to less than 550 nm. Such spectral transmittance characteristic is set, thereby making it possible to further suppress excessive occurrence of a ripple and excessive change in reflected color regardless of the incident angle.

Further, the portion in which the transmittance difference $(T_1-T_2)$ becomes 1.65% or more preferably exists in the wavelength range of 500 nm or more to less than 550 nm and in a wavelength range of 450 nm or more to less than 500 nm. Such spectral transmittance characteristic is set, thereby making it possible to further suppress excessive occurrence of a ripple and excessive change in reflected color regardless of the incident angle.

The portion in which the transmittance difference $(T_1-T_2)$ becomes 1.65% or more is preferred to be a portion with the minimum transmittance of a ripple, namely a portion with the minimum transmittance $T_7$ out of the transmittance $T_2$, if there is only one ripple in the wavelength range of 450 nm or more to less than 550 nm. That is, the wavelength range of 450 nm or more to less than 550 nm preferably has at least one ripple in which the difference obtained by subtracting the minimum transmittance from the mean transmittance $T_1$ becomes 1.65% or more. The wavelength range of 500 nm or more to less than 550 nm preferably has at least one ripple in which the difference obtained by subtracting the minimum transmittance from the mean transmittance $T_1$ becomes 1.65% or more.

Particularly, the wavelength range of 500 nm or more to less than 550 nm preferably has at least one ripple in which the difference obtained by subtracting the minimum transmittance from the mean transmittance $T_1$ becomes 1.65% or more, and the wavelength range of 450 nm or more to less than 500 nm preferably has at least one ripple in which the difference obtained by subtracting the minimum transmittance from the mean transmittance $T_1$ becomes 1.65% or more. Incidentally, the ripple is set to exist within the above range as long as at least the minimum transmittance exists within the above range.

The transmittance $T_2$ of the wavelength range of 450 nm or more to less than 550 nm is preferably 85% or more in the entire region. Such spectral transmittance characteristic is set, thereby making it possible to further suppress excessive occurrence of a ripple and excessive change in reflected color effectively regardless of the incident angle. The transmittance $T_2$ of the wavelength range of 450 nm or more to less than 550 nm is more preferably 88% or more and further preferably 92% or more in the entire region.

A transmittance $T_5$ of a wavelength range of not less than 550 nm nor more than 700 nm is preferably 90% or more in the entire region. Such spectral transmittance characteristic is set, thereby making it possible to further suppress excessive occurrence of a ripple and excessive change in reflected color effectively regardless of the incident angle. The transmittance $T_5$ of the wavelength range of not less than 550 nm nor more than 700 nm is more preferably 91% or more, further preferably 92% or more, and particularly preferably 93% or more in the entire region. Note in this description, $T_5$ is any transmittance in the wavelength range of not less than 550 nm nor more than 700 nm when the incident angle of light is 0 degree.

Next, the spectral transmittance characteristic when the incident angle of light is 40 degrees will be explained. It is sufficient when the portion in which the difference $(T_3-T_4)$ obtained by subtracting the transmittance $T_4$ from the mean transmittance $T_3$ of the wavelength range of 450 nm to 700 nm becomes 3.5% or more exists in the wavelength range of 450 nm or more to less than 550 nm. The above portion preferably exists in the wavelength range of 450 nm or more to less than 500 nm, and more preferably exists in a wavelength range of 455 nm or more to less than 490 nm. Such spectral transmittance characteristic is set, thereby making it possible to suppress excessive occurrence of a ripple and excessive change in reflected color regardless of the incident angle. Note in this description, $T_3$ is the mean transmittance of the wavelength range of 450 nm to 700 nm when the incident angle of light is 40 degrees, and $T_4$ is any transmittance in the wavelength range of 450 nm or more to less than 550 nm when the incident angle of light is 40 degrees. Hereinafter, the difference ($T_3-T_4$) obtained by subtracting the transmittance $T_4$ from the mean transmittance $T_3$ of the wavelength range of 450 nm to 700 nm will be described as a "transmittance difference ($T_3-T_4$)" simply. Further, the mean transmittance $T_3$ of the wavelength range of 450 nm to 700 nm will be described as a "mean transmittance $T_3$" simply. The portion in which the transmittance difference ($T_3-T_4$) becomes 3.5% or more further includes a portion in which the transmittance difference ($T_3-T_4$) becomes 3.9% or more.

Out of the portion in which the transmittance difference ($T_3-T_4$) becomes 3.5% or more, a portion having the largest transmittance difference ($T_3-T_4$), namely a portion having the smallest transmittance $T_8$ out of the transmittance $T_4$ preferably exists in the wavelength range of 450 nm or more to less than 500 nm, and more preferably exists in the wavelength range of 455 nm or more to less than 490 nm. Such spectral transmittance characteristic is set, thereby making it possible to further suppress excessive occurrence of a ripple and excessive change in reflected color regardless of the incident angle.

The portion in which the transmittance difference ($T_3-T_4$) becomes 3.5% or more is preferred to be a portion with the minimum transmittance of a ripple, namely a portion with the minimum transmittance $T_8$ out of the transmittance $T_4$, if there is only one ripple in the wavelength range of 450 nm or more to less than 550 nm. That is, the wavelength range of 450 nm or more to less than 550 nm preferably has at least one ripple in which the difference obtained by subtracting the minimum transmittance from the mean transmittance $T_3$ becomes 3.5% or more. Further, in the wavelength range of 450 nm or more to less than 550 nm preferably there are two or more of ripples in which the difference obtained by subtracting the minimum transmittance from the mean transmittance $T_3$ becomes 1.0% or more, and more preferably three or more of them, including such a ripple in which the difference obtained by subtracting the minimum transmittance from the mean transmittance $T_3$ becomes 3.5% or more. Further, when there exist a plurality of ripples in which the difference obtained by subtracting the minimum transmittance from the mean transmittance $T_3$ becomes 1.0% or more, the minimum transmittance preferably becomes larger toward the ripple on the high wavelength side from the ripple in which the difference obtained by subtracting the minimum transmittance from the mean transmittance $T_3$ becomes 3.5% or more.

The transmittance $T_4$ of the wavelength range of 450 nm or more to less than 550 nm is preferably 85% or more in the entire region. Such spectral transmittance characteristic is set, thereby making it possible to further suppress excessive occurrence of a ripple and excessive change in reflected color effectively regardless of the incident angle. The transmittance $T_4$ of the wavelength range of 450 nm or more to less than 550 nm is more preferably 86% or more and further preferably 87% or more in the entire region.

A transmittance $T_6$ of the wavelength range of not less than 550 nm nor more than 700 nm is preferably 90% or more in the entire region. Such spectral transmittance characteristic is set, thereby making it possible to further suppress excessive occurrence of a ripple and excessive change in reflected color effectively regardless of the incident angle. The transmittance $T_6$ of the wavelength range of not less than 550 nm nor more than 700 nm is more preferably 91% or more, and further preferably 92% or more in the entire region. Note, in this description, $T_6$ is any transmittance in the wavelength range of not less than 550 nm nor more than 700 nm when the incident angle of light is 40 degrees.

In the near-infrared cut filter 10, in addition to the above spectral transmittance characteristic, the spectral transmittance characteristic when the incident angle is 0 degree preferably satisfy the following.

The difference (half-value wavelength difference) between a half-value wavelength (a wavelength whose transmittance becomes 50%) to be the ultraviolet side of the transmission band and a half-value wavelength to be the near-infrared side of the transmission band is preferably 200 nm or more, more preferably 250 nm or more, and further preferably 300 nm or more. The half-value wavelength difference is preferably 500 nm or less.

The half-value wavelength to be the ultraviolet side of the transmission band exists preferably in 350 nm to 450 nm, more preferably in 380 nm to 420 nm, and further preferably in 390 nm to 405 nm. The half-value wavelength to be the near-infrared side of the transmission band exists preferably in 650 nm to 900 nm, more preferably in 700 nm to 870 nm, and further preferably in 750 nm to 860 nm.

The difference (ultraviolet-side moving amount) between the half-value wavelength to be the ultraviolet side of the transmission band when the incident angle is 0 degree and the half-value wavelength to be the ultraviolet side of the transmission band when the incident angle is 40 degrees is preferably 25 nm or less, and more preferably 23 nm or less. The ultraviolet-side moving amount is preferably 10 nm or more, and more preferably 15 nm or more. On the other hand, the difference (near-infrared-side moving amount) between the half-value wavelength to be the near-infrared side of the transmission band when the incident angle is 0 degree and the half-value wavelength to be the near-infrared side of the transmission band when the incident angle is 40 degrees is preferably 65 nm or less, and more preferably 63 nm or less. The near-infrared-side moving amount is preferably 50 nm or more, and more preferably 55 nm or more.

In the near-infrared cut filter 10, a mean transmittance of a wavelength range of 870 nm to 1100 nm is preferably 3% or less when the incident angle of light is 0 degree to 40 degrees. When such a condition is satisfied, the near-infrared light is sufficiently blocked, resulting in that the characteristic as the near-infrared cut filter improve. The above-described mean transmittance is more preferably 2% or less.

Further, the near-infrared cut filter 10 preferably has an achromatic (white) reflected color even when the incident angle of light is any one of 0 degree to 80 degrees. Note that the reflected color is based on general chromaticity classification in "FIG. 1 attached for reference; Systematic color names" of "JIS Z8110: 1995; Color specification-Names of light-source color" as a matter of convenience.

The optical multilayer film 12 has, for example, a ((L/2) (M/2) H (M/2) (L/2)) structure part, a ((L/2) H (L/2)) structure part, and an equivalent film replacement structure in which a middle-refractive index film M is replaced with a high-refractive index film H and a low-refractive index film L. Such a constitution is applied and the thickness of each of the films is fine-adjusted by a method to be described later, thereby making it possible to obtain predetermined spectral transmittance characteristics.

Here, "(L/2) (M/2) H (M/2) (L/2)" means that an optical film (L/2), an optical film (M/2), an optical film H, an optical film (M/2), and an optical film (L/2) are stacked in order. "(L/2) H (L/2)" means that an optical film (L/2), an optical film H, and an optical film (L/2) are stacked in order.

The optical film H means a high-refractive index film having an optical film thickness of a ¼ wavelength (for example, an optical film thickness of 125 nm at the wavelength of 500 nm). The optical films (M/2) and (L/2) mean a middle-refractive index film having an optical film thickness of a ⅛ wavelength and a low-refractive index film having an optical film thickness of a ⅛ wavelength respectively (for example, an optical film thickness of 62.5 nm at the wavelength of 500 nm).

The high-refractive index film is an optical film whose refractive index at the wavelength of 500 nm is 2.0 or more. The middle-refractive index film is an optical film whose refractive index at the wavelength of 500 nm is 1.6 or more and less than the refractive index of the aforementioned high-refractive index film. The low-refractive index film is an optical film whose refractive index at the wavelength of 500 nm is less than 1.6.

The optical multilayer film 12 has a structure in which the ((L/2) H (L/2)) structure part is sandwiched between the ((L/2) (M/2) H (M/2) (L/2)) structure parts, for example. Further, the ((L/2) (M/2) H (M/2) (L/2)) structure part and the ((L/2) H (L/2)) structure part may be stacked in this order from the transparent substrate 11 side or may also be stacked in the order reverse to this. The ((L/2) (M/2) H (M/2) (L/2)) structure part and the ((L/2) H (L/2)) structure part each can be stacked so as to be divided into two or more portions. Incidentally, in these cases as well, the optical multilayer film 12 preferably has the equivalent film replacement structure in which the middle-refractive index film M is replaced with the high-refractive index film H and the low-refractive index film L. Such a constitution is applied, thereby making it possible to effectively obtain predetermined spectral transmittance characteristic.

The concrete constitution of the optical multilayer film 12 can be obtained by performing adjustment with the incident angle set to 0 degree and performing adjustment with the incident angle set to 40 degrees, for example. For example, the thickness of each of high-refractive index films 12a and the thickness of each of low-refractive index films 12b can be obtained by performing adjustment with the incident angle set to 0 degree and performing adjustment with the incident angle set to 40 degrees. Specifically, occurrence of a ripple is evaluated with the incident angle set to 0 degree, and then occurrence of a ripple is evaluated with the incident angle set to 40 degrees. Such a series of processes is performed repeatedly, and the thickness of each of layers is fine-adjusted so that the occurrence of a ripple when the incident angle is 0 degree and the occurrence of a ripple when the incident angle is 40 degrees are both reduced. Such processes can be performed by utilizing software capable of simulating the spectral transmittance characteristics of the optical multilayer film from a film structure.

Note that the above-described simulation is not limited to the combination of the incident angle of 0 degree and the incident angle of 40 degrees. For the combination of incident angles, incident angles on a solid-state image sensing device that are required with a wider angle of an optical apparatus such as a digital camera can be used appropriately. The thickness of each of layers may also be adjusted by performing the simulation with the combination of the incident angle of 0 degree and the incident angle of 45 degrees, for example.

The high-refractive index film 12a is not particularly limited as long as it is made of a material having a refractive index at the wavelength of 500 nm of 2.0 or more. As the refractive index is higher, a cutoff band can be formed with the smaller number of layers and a thinner film thickness. The refractive index is more preferably 2.2 or more. As the material with the high refractive index as described above, for example, titanium oxide ($TiO_2$), niobium oxide ($Nb_2O_5$), tantalum oxide ($Ta_2O_5$), or a composite oxide thereof can be preferably cited. Further, the material may contain an additive as long as the refractive index is 2.0 or more. Incidentally, when the refractive index is too high, optical design becomes difficult to be performed because of a problem that a ripple in the transmission band becomes likely to occur, or the like. Therefore, the refractive index is preferably 2.8 or less, and more preferably 2.5 or less from a viewpoint of reliability.

The low-refractive index film 12b is not particularly limited as long as it is made of a material having a refractive index at the wavelength of 500 nm of less than 1.6. As the refractive index is lower, a cutoff band can be formed with the smaller number of layers and a thinner film thickness. The refractive index is more preferably less than 1.5. As the material with the low refractive index as described above, silicon oxide ($SiO_2$) can be preferably cited, for example. Further, the material may contain an additive as long as the refractive index is less than 1.6. Incidentally, when the refractive index is too low, optical design becomes difficult to be performed because of a problem that a ripple in the transmission band becomes likely to occur, or the like. Therefore, the refractive index is preferably 1.2 or more, and more preferably 1.3 or more from a viewpoint of reliability.

The whole number of layers combining the high-refractive index films 12a and the low-refractive index films 12b is preferably not less than 35 nor more than 80. The whole physical film thickness combining the high-refractive index films 12a and the low-refractive index films 12b is preferably not less than 3 μm nor more than 6 μm. Among the high-refractive index films 12a and the low-refractive index films 12b, the film that is farthest from the transparent substrate 11 is preferred to be the low-refractive index film 12b.

The optical multilayer film 12 has a plurality of stack units each constituted of the high-refractive index film 12a and the low-refractive index film 12b adjacent thereto basically. Note that the low-refractive index film 12b constituting each of the stack units is the low-refractive index film 12b to be disposed, out of both the principal surface sides of the high-refractive index film 12a, on the principal surface side away from the transparent substrate 11.

When the optical multilayer film 12 is composed of a plurality of stack units, regarding a portion of the remaining stack units except the stack unit closest to the transparent substrate 11 and the stack unit farthest from the transparent substrate 11 from the optical multilayer film 12, the number of stack units each having an optical film thickness ratio L obtained by the following expression with an optical film thickness $L_1$ of the high-refractive index film 12a and an optical film thickness $L_2$ of the low-refractive index film 12b being greater than 0.22 to less than 0.50 is preferably 2 or less. Note that the optical film thicknesses $L_1$ and $L_2$ each can be obtained as the product of the physical film thickness and the refractive index of the film.

$$L=L_1/L_2$$

The stack unit closest to the transparent substrate 11 sometimes has a case where the optical film thickness ratio L is outside the range of the above-described range due to adjustment of the refractive index with the transparent substrate 11. The stack unit farthest from the transparent substrate 11 sometimes has a case where the optical film thickness ratio L is outside the range of the above-described range due to adjustment of the refractive index with a function film performed when the function film is formed on the surface of the optical multilayer film 12, adjustment of the refractive index with the air performed when the function film is not formed, or the like. Regarding the portion of the remaining stack units except the stack units at both end portions from the optical multilayer film 12, when the number of stack units each having the optical film thickness ratio L of greater than 0.22 to less than 0.50 is 2 or less, occurrence of a ripple and change in reflected color can be suppressed effectively. Regarding the same portion, the number of stack units each having the optical film thickness ratio of greater than 0.22 to less than 0.50 is preferably 1 or less, and more preferably 0.

The high-refractive index film 12*a* and the low-refractive index film 12*b* can be formed for example by the sputtering method, the vacuum deposition method, the ion assisted deposition method, the ion beam method, the ion plating method, and the CVD method. Particularly, the high-refractive index film 12*a* and the low-refractive index film 12*b* are preferably formed by the sputtering method or the vacuum deposition method. The transmission band is a wavelength band utilized for receiving light by a solid-state image sensing device such as a CCD or a CMOS and its film thickness accuracy is important. The sputtering method, the vacuum deposition method, and the ion assisted deposition method are excellent in film thickness control when forming a thin film. Therefore, it is possible to increase the accuracy of the film thicknesses of the high-refractive index film 12*a* and the low-refractive index film 12*b*, resulting in suppression of a ripple.

Incidentally, the near-infrared cut filter 10 may also be provided with a function film other than the optical multilayer film 12, in addition to the optical multilayer film 12. The function film is preferably provided on, out of both the principal surfaces of the optical multilayer film 12, the principal surface opposite to the principal surface on which the transparent substrate 11 is provided, or the like. Note that the function film may also be provided on, out of both the principal surfaces of the transparent substrate 11, the principal surface opposite to the principal surface on which the optical multilayer film 12 is provided. As the function film, an adherence enhancing layer, an antistatic layer, an anti-fingerprint surface-treated layer (AFP: Anti Finger Print) as an antifouling layer, and the like can be cited. As the refractive index of the function film is lower, its interface reflection becomes smaller. Therefore, the refractive index of the function film at the wavelength of 500 nm is preferably less than 1.5, and more preferably less than 1.4. Further, the refractive index of the function film at the wavelength of 500 nm is preferably 1.1 or more from a viewpoint of accessibility of a material, and more preferably 1.2 or more from a viewpoint of reliability.

The near-infrared cut filter 10 can be preferably used as a luminous factor correction filter in an imaging device, an automatic exposure meter, and the like. The imaging device has a solid-state image sensing device, and has at least the near-infrared cut filter 10 on the imaging plane side of this solid-state image sensing device.

Figure 3:
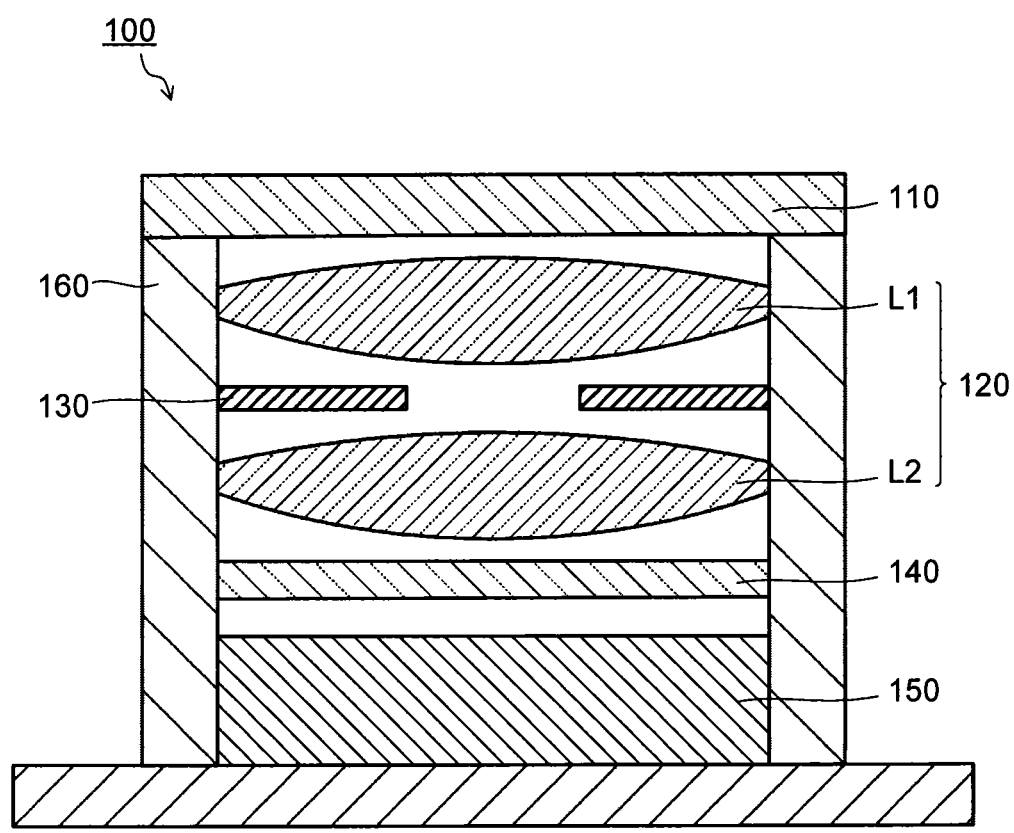
FIG. 3 is a constitution view illustrating one embodiment of an imaging device.
Figure 4:
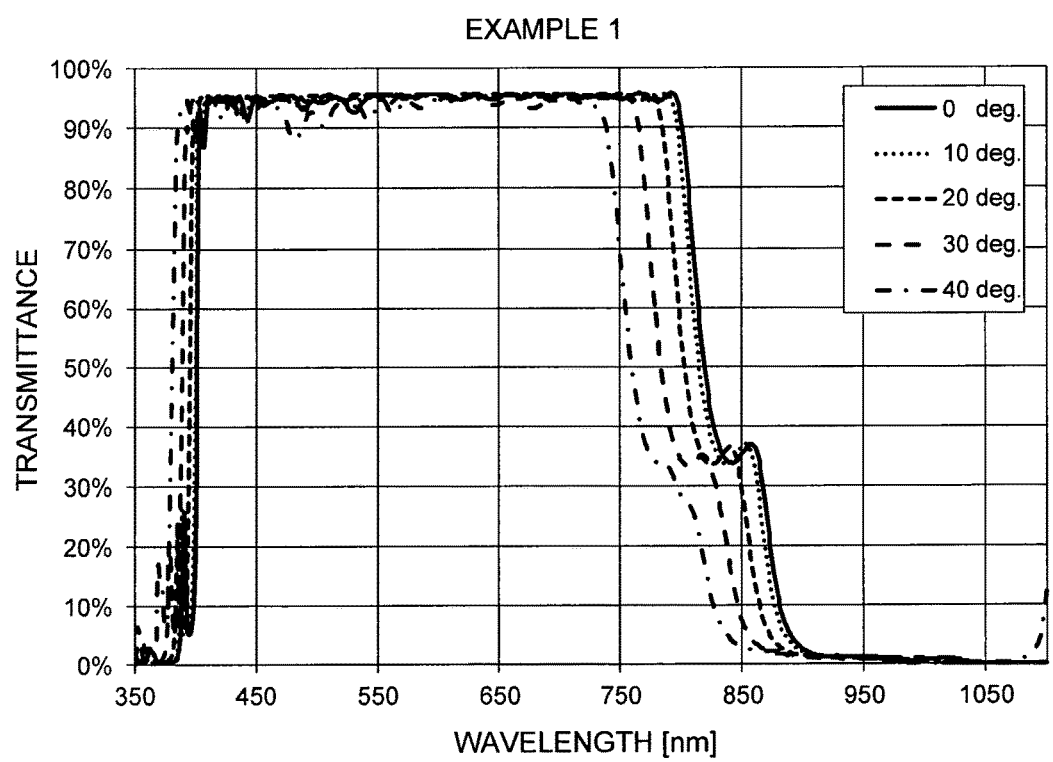
FIG. 4 is a view illustrating spectral transmittance characteristics of a near-infrared cut filter in Example 1.
Figure 5:
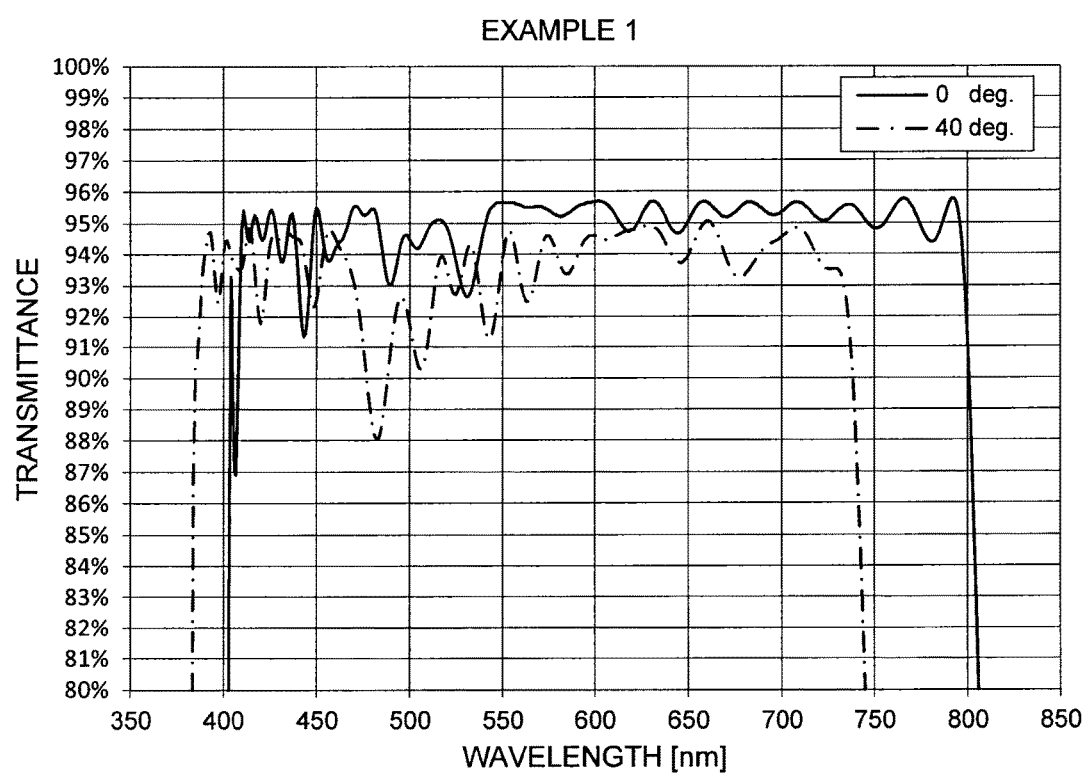
FIG. 5 is a partial enlarged view of the spectral transmittance characteristics illustrated in FIG. 4.
Figure 6:
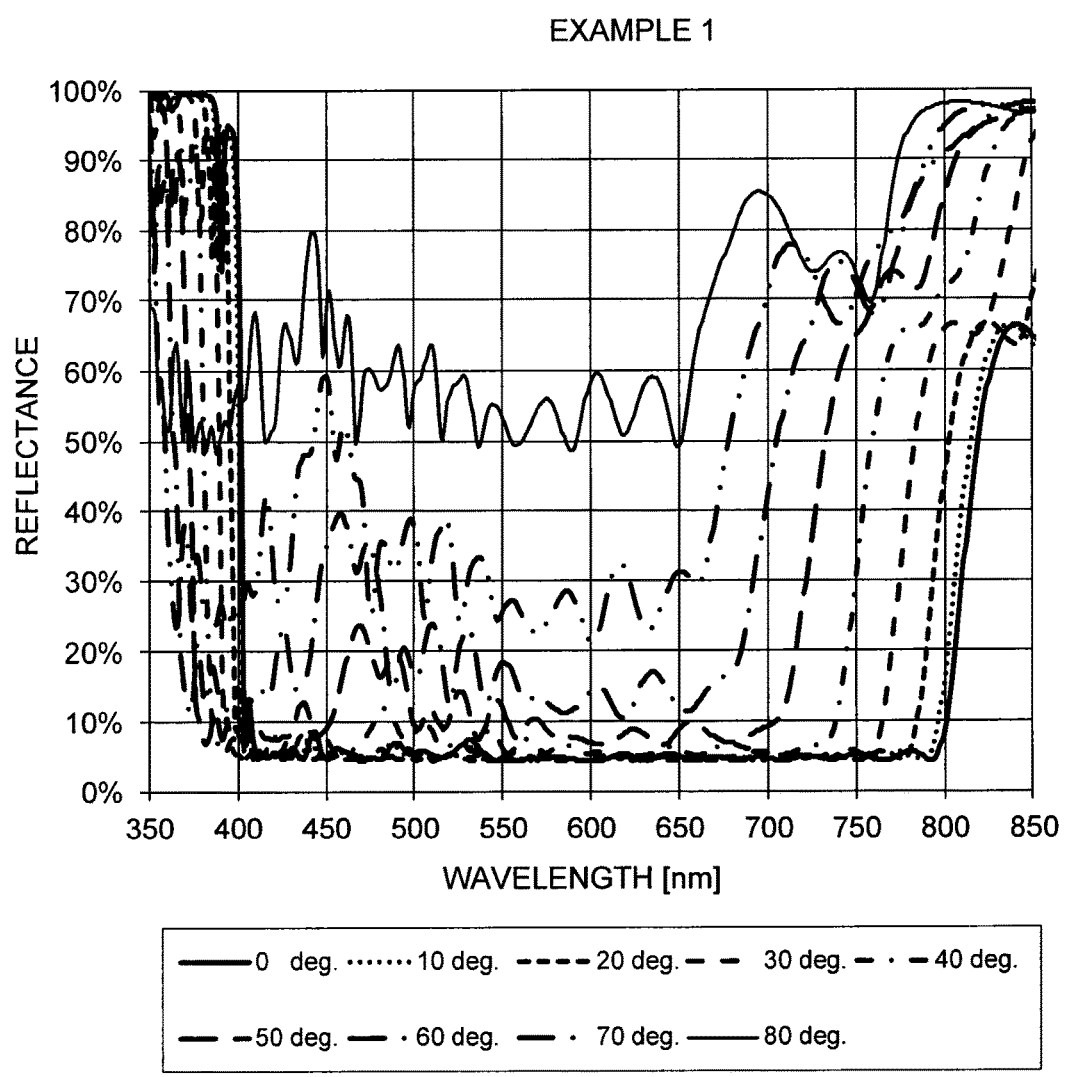
FIG. 6 is a view illustrating spectral reflectance characteristics of the near-infrared cut filter in Example 1.
Figure 7:
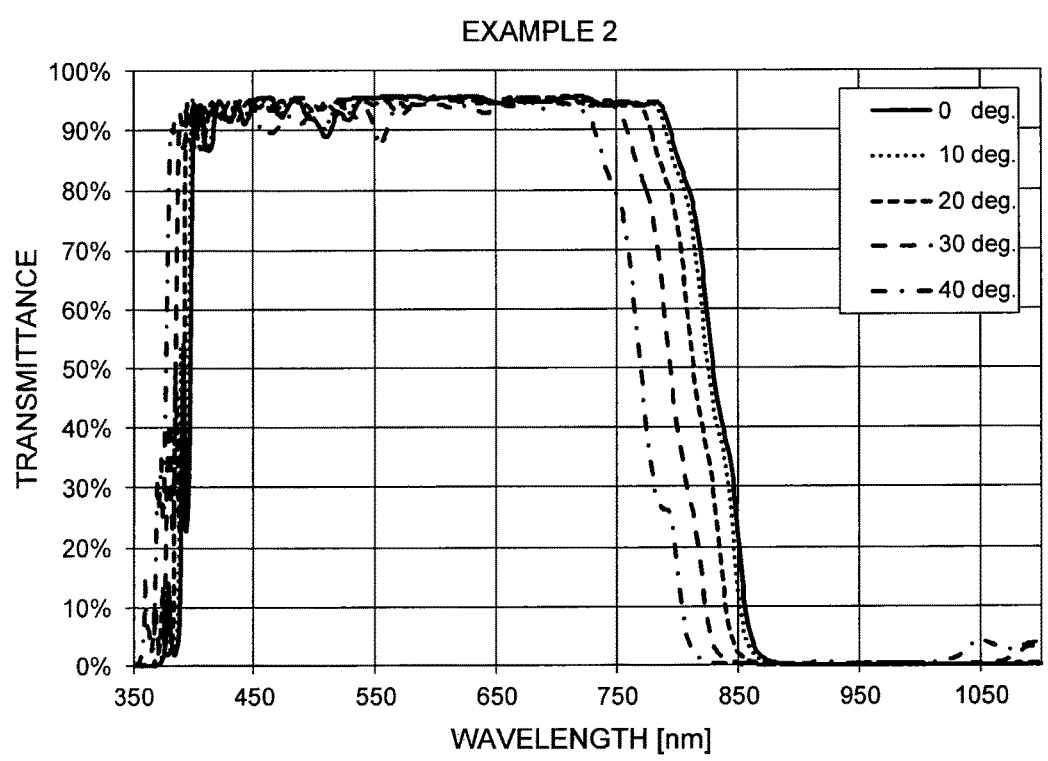
FIG. 7 is a view illustrating spectral transmittance characteristics of a near-infrared cut filter in Example 2.
Figure 8:
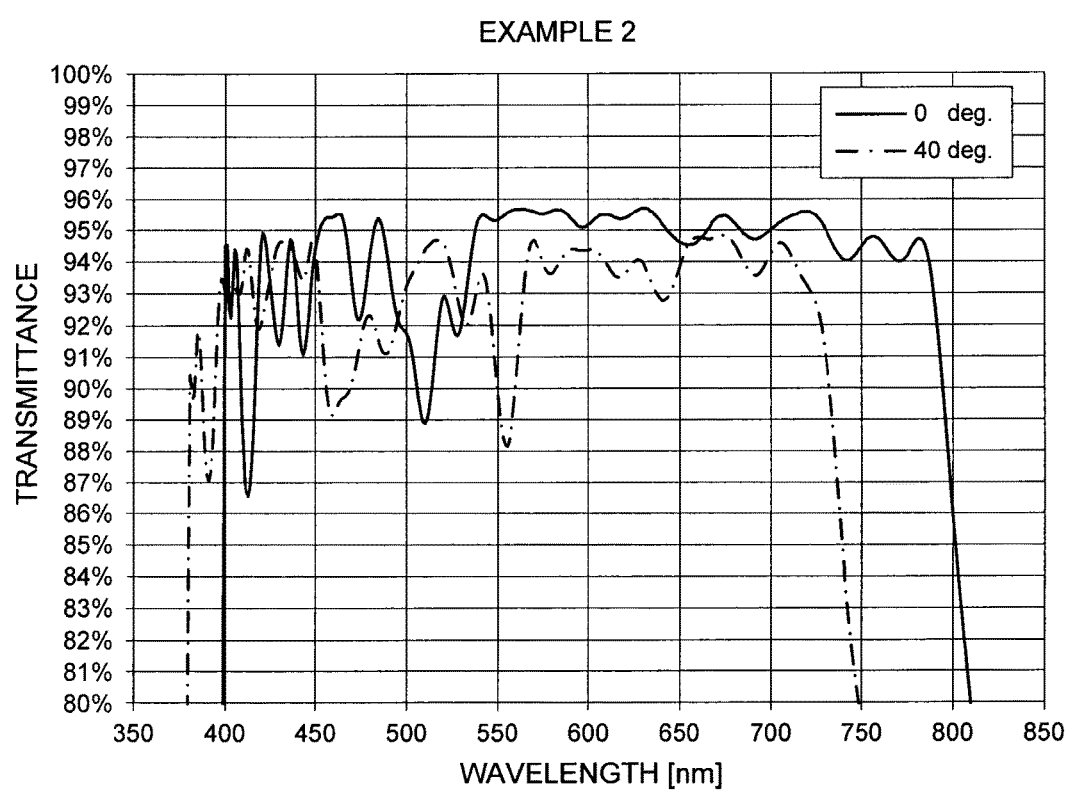
FIG. 8 is a partial enlarged view of the spectral transmittance characteristics illustrated in FIG. 7.
Figure 9:
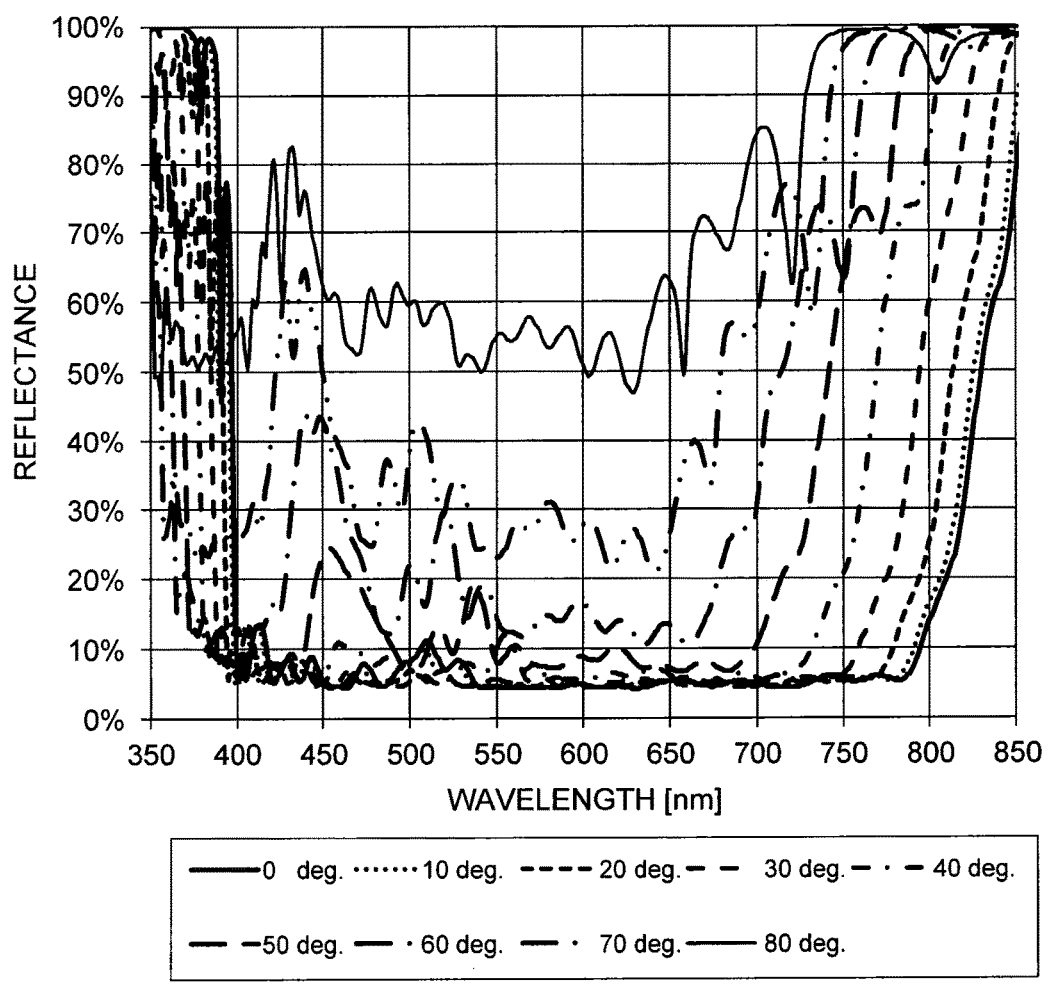
FIG. 9 is a view illustrating spectral reflectance characteristics of the near-infrared cut filter in Example 2.
Figure 10:
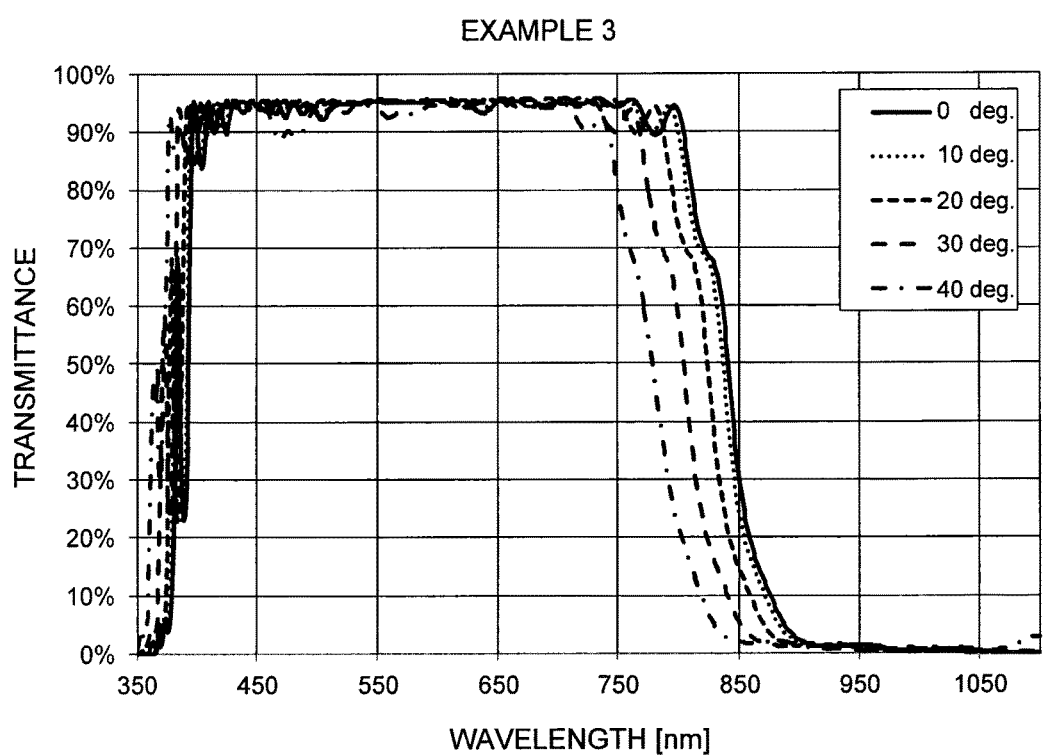
FIG. 10 is a view illustrating spectral transmittance characteristics of a near-infrared cut filter in Example 3.
Figure 11:
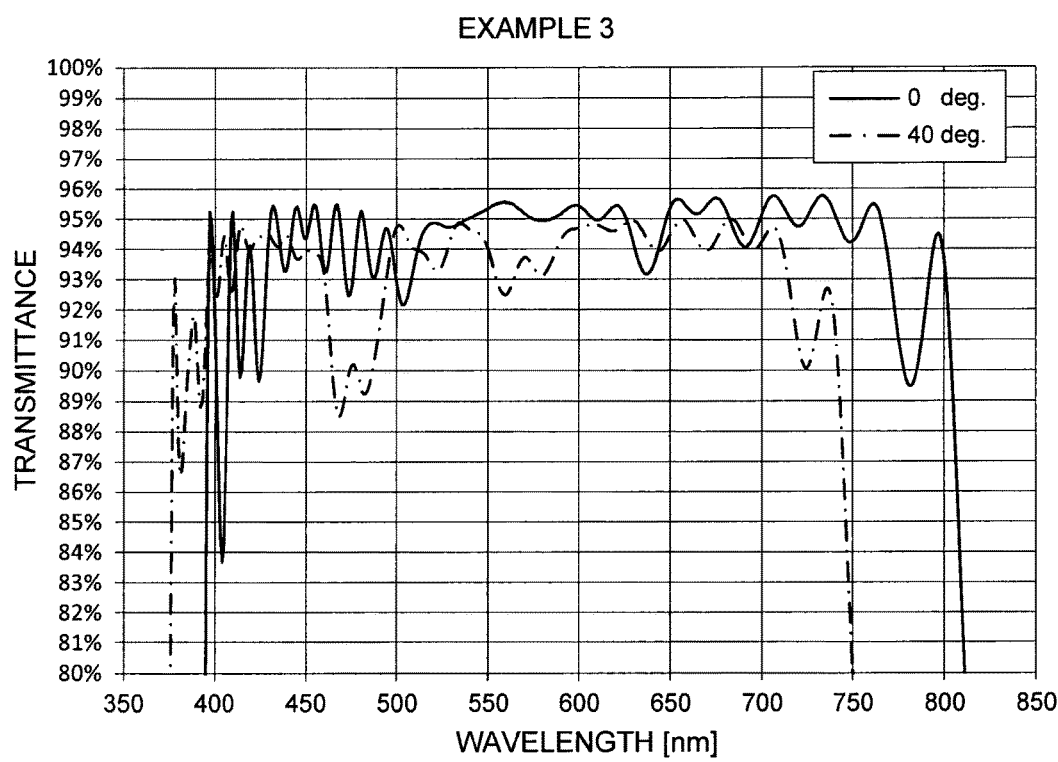
FIG. 11 is a partial enlarged view of the spectral transmittance characteristics illustrated in FIG. 10.
Figure 12:
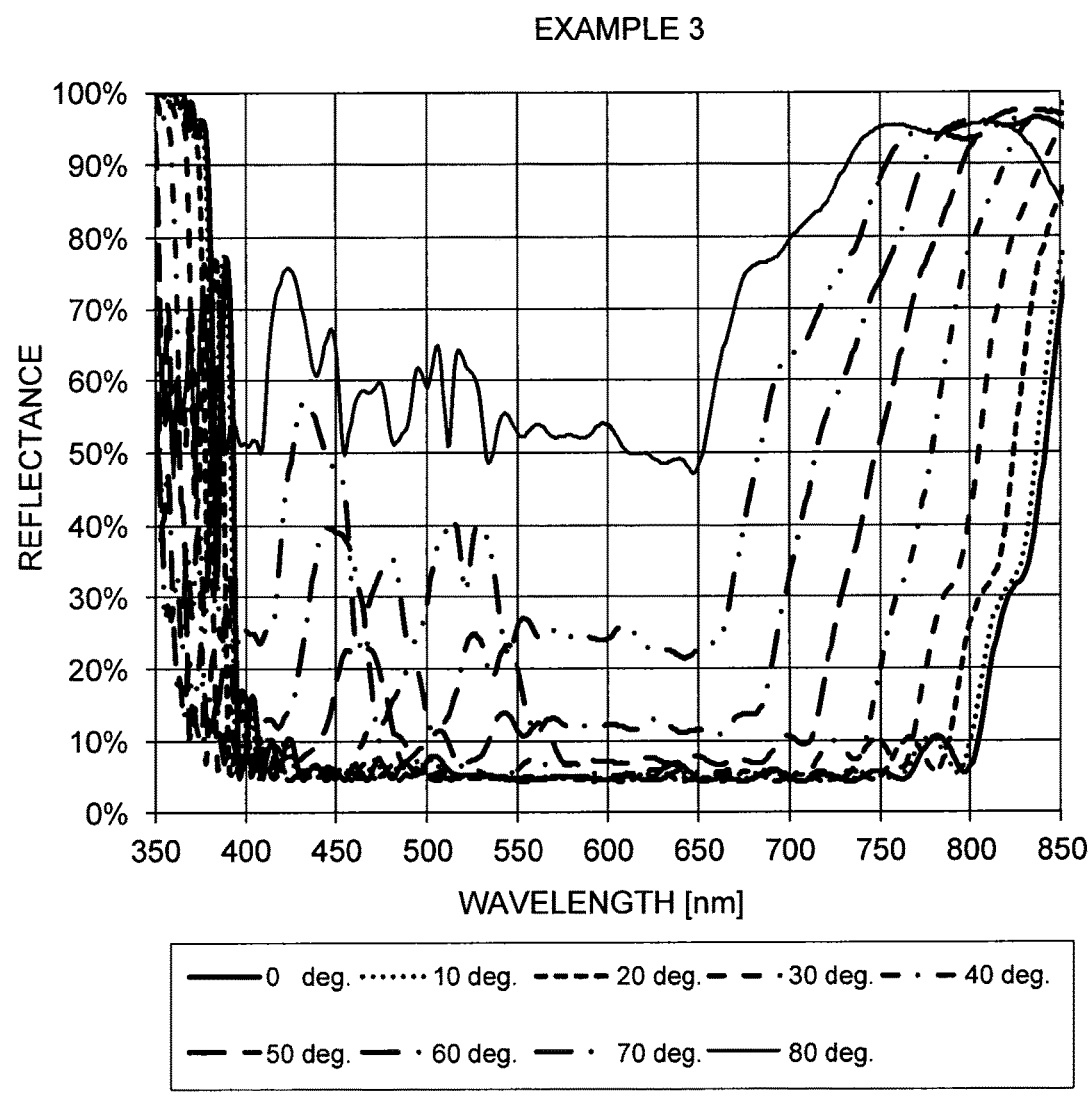
FIG. 12 is a view illustrating spectral reflectance characteristics of the near-infrared cut filter in Example 3.
Figure 13:
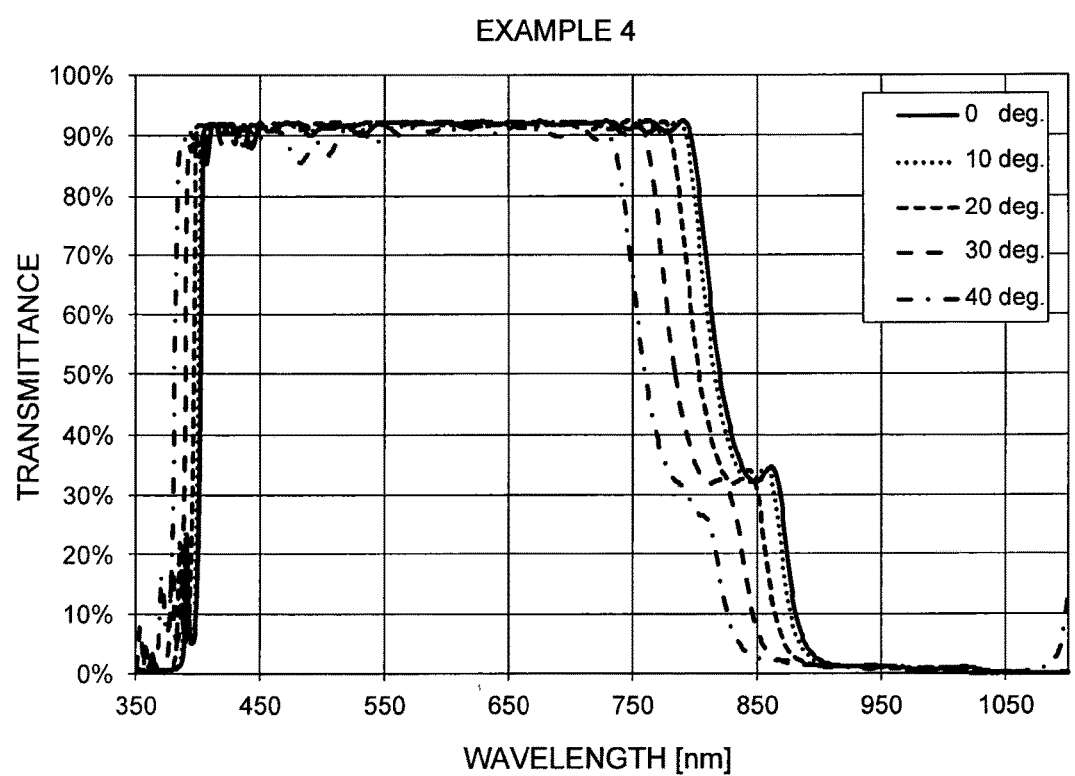
FIG. 13 is a view illustrating spectral transmittance characteristics of a near-infrared cut filter in Example 4.
Figure 14:
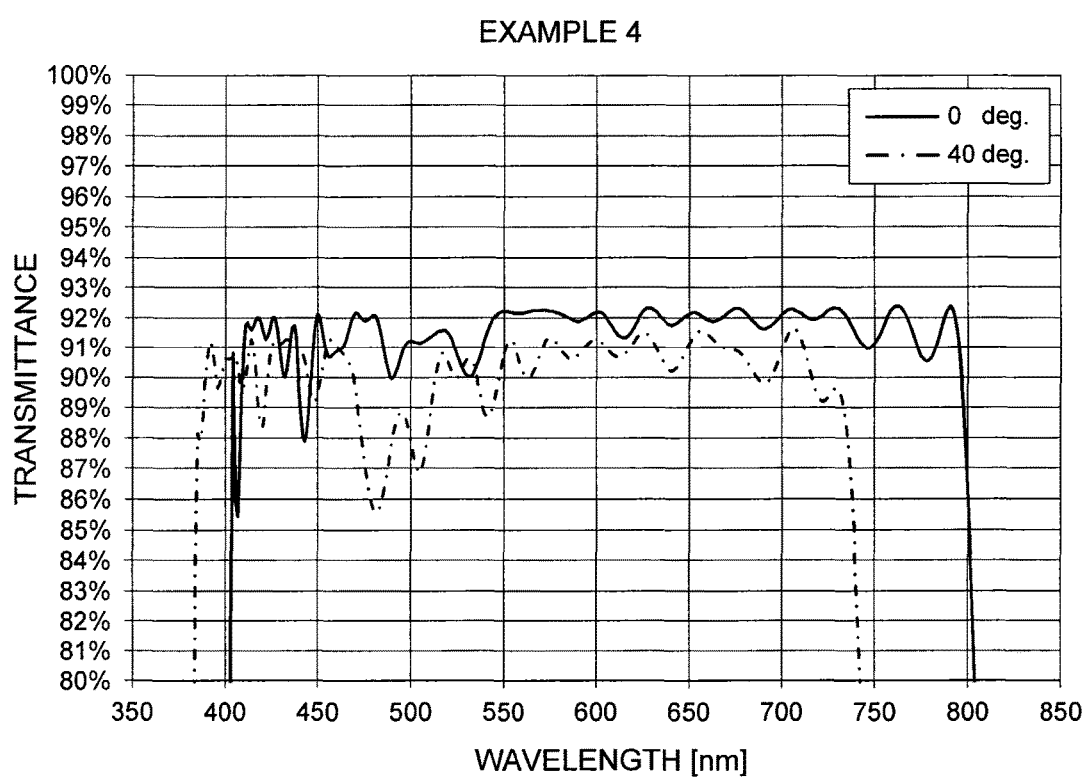
FIG. 14 is a partial enlarged view of the spectral transmittance characteristics illustrated in FIG. 13.
Figure 15:
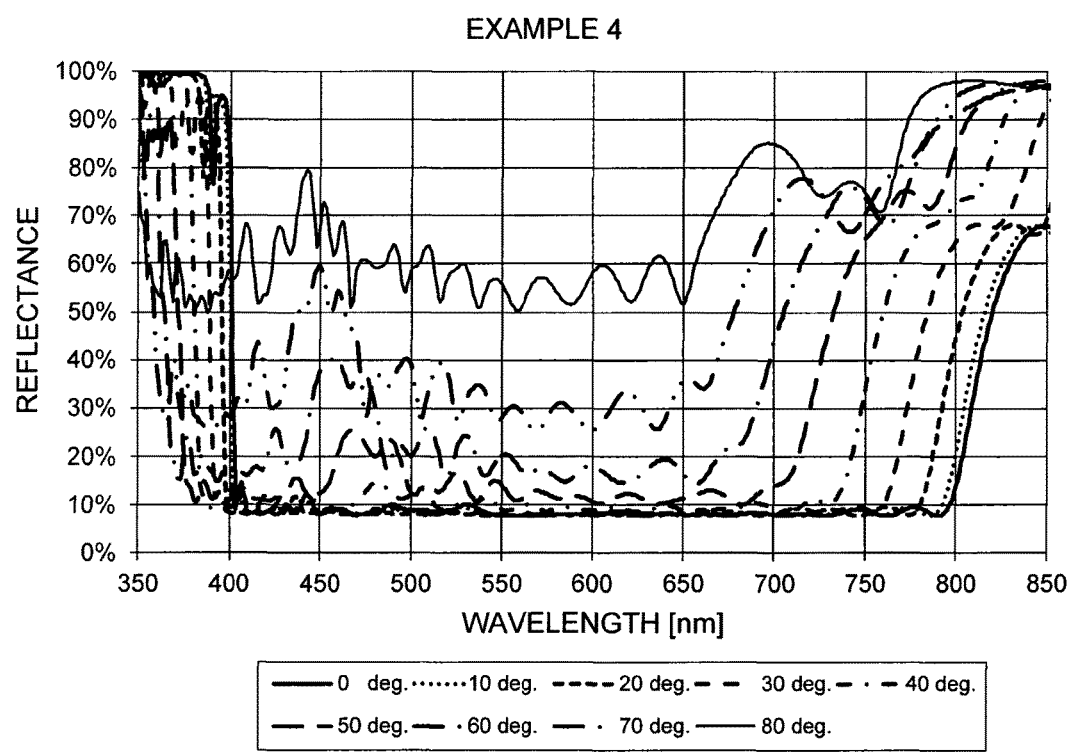
FIG. 15 is a view illustrating spectral reflectance characteristics of the near-infrared cut filter in Example 4.
Figure 16:
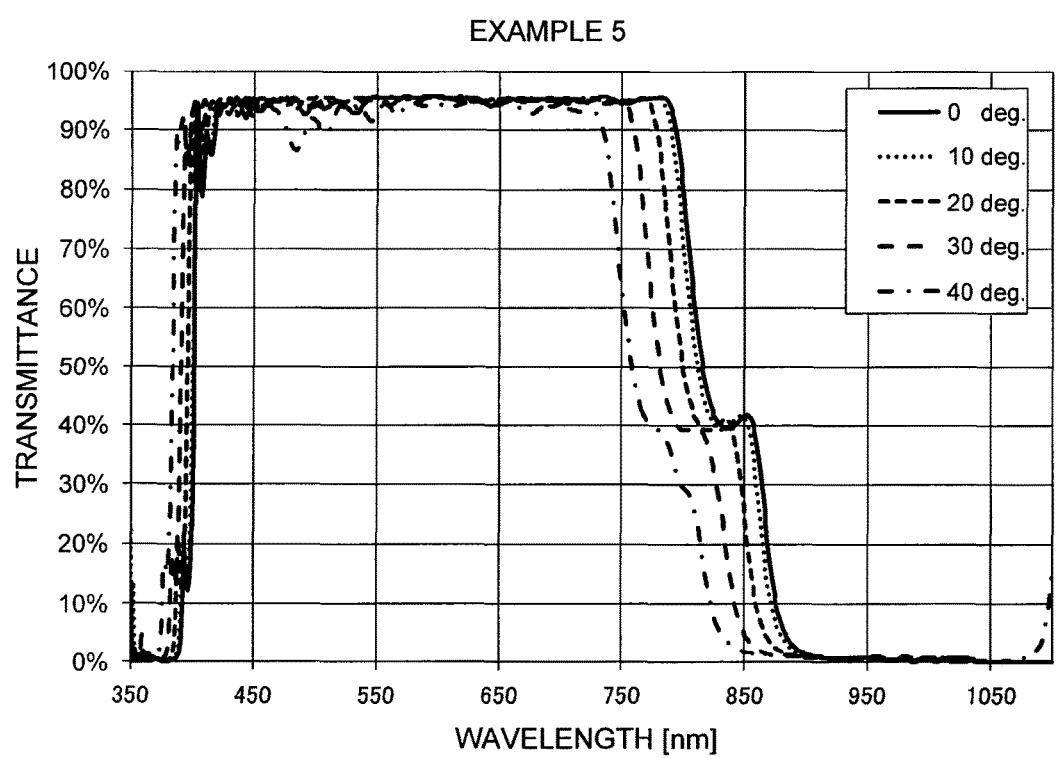
FIG. 16 is a view illustrating spectral transmittance characteristics of a near-infrared cut filter in Example 5.
Figure 17:
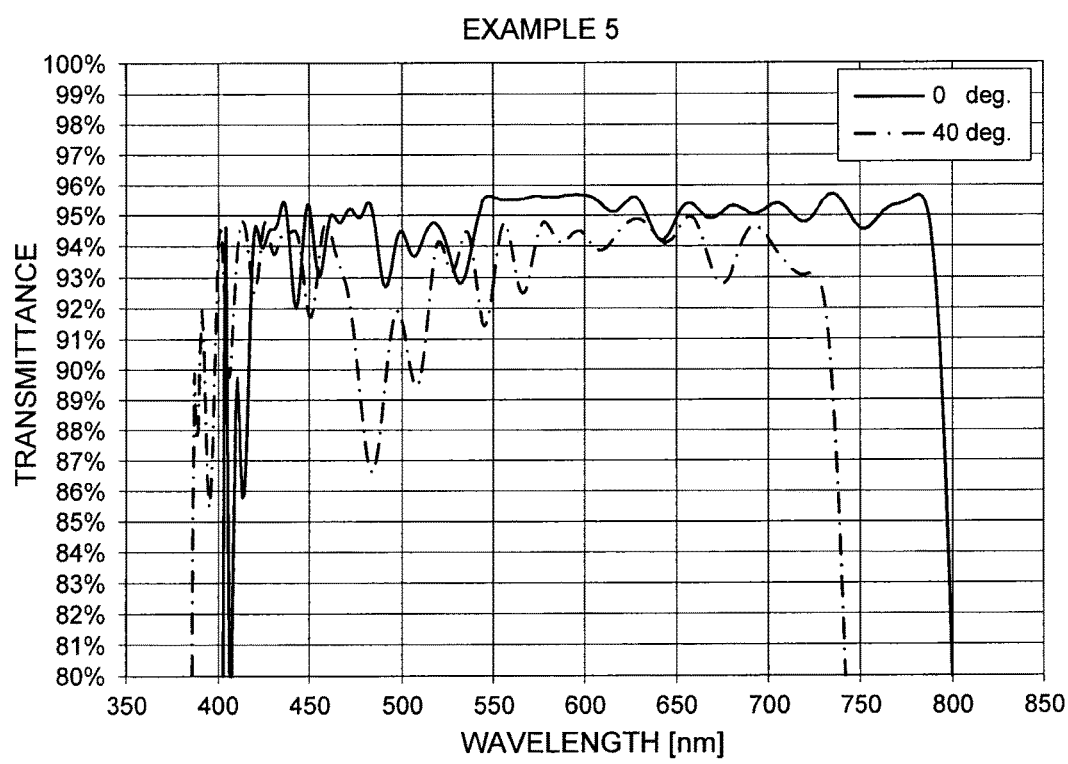
FIG. 17 is a partial enlarged view of the spectral transmittance characteristics illustrated in FIG. 16.
Figure 18:
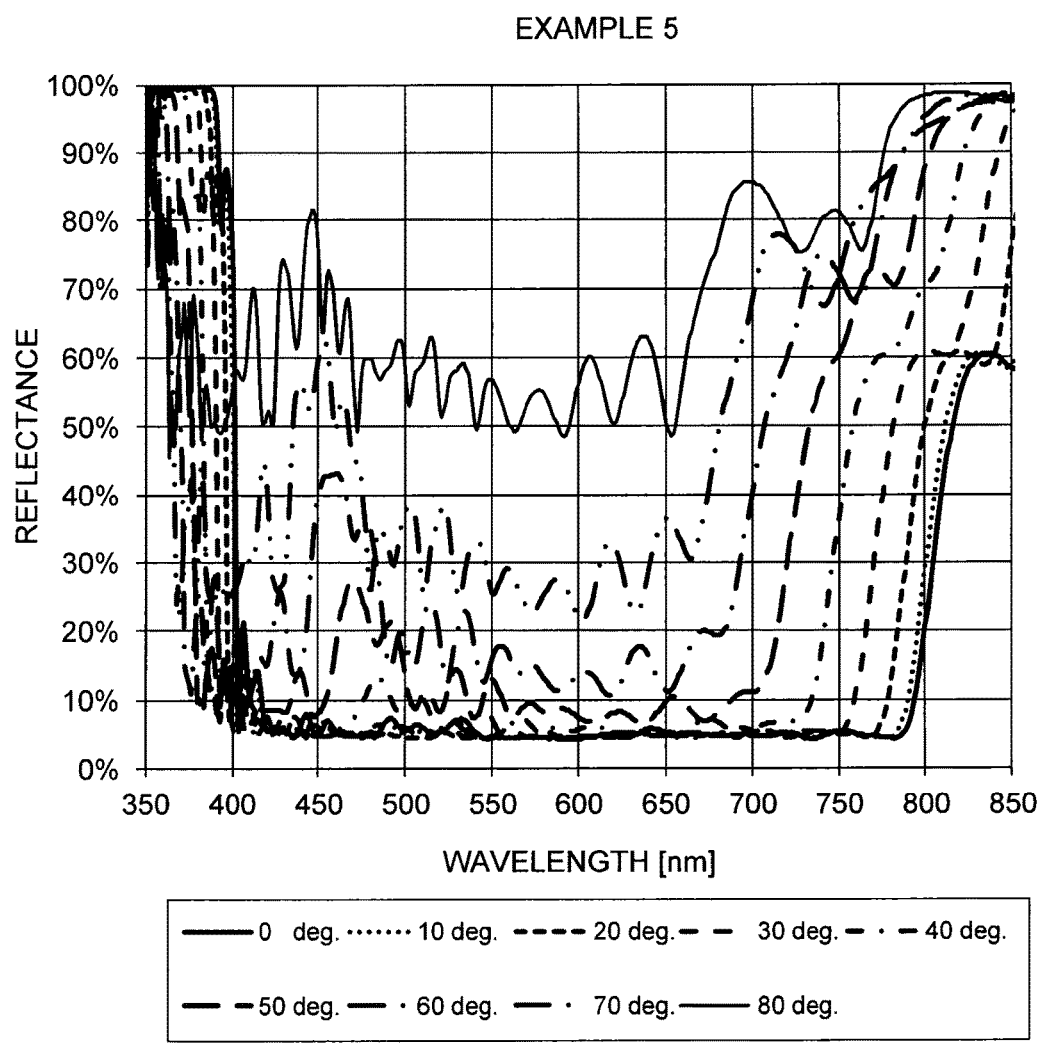
FIG. 18 is a view illustrating spectral reflectance characteristics of the near-infrared cut filter in Example 5.
Figure 19:
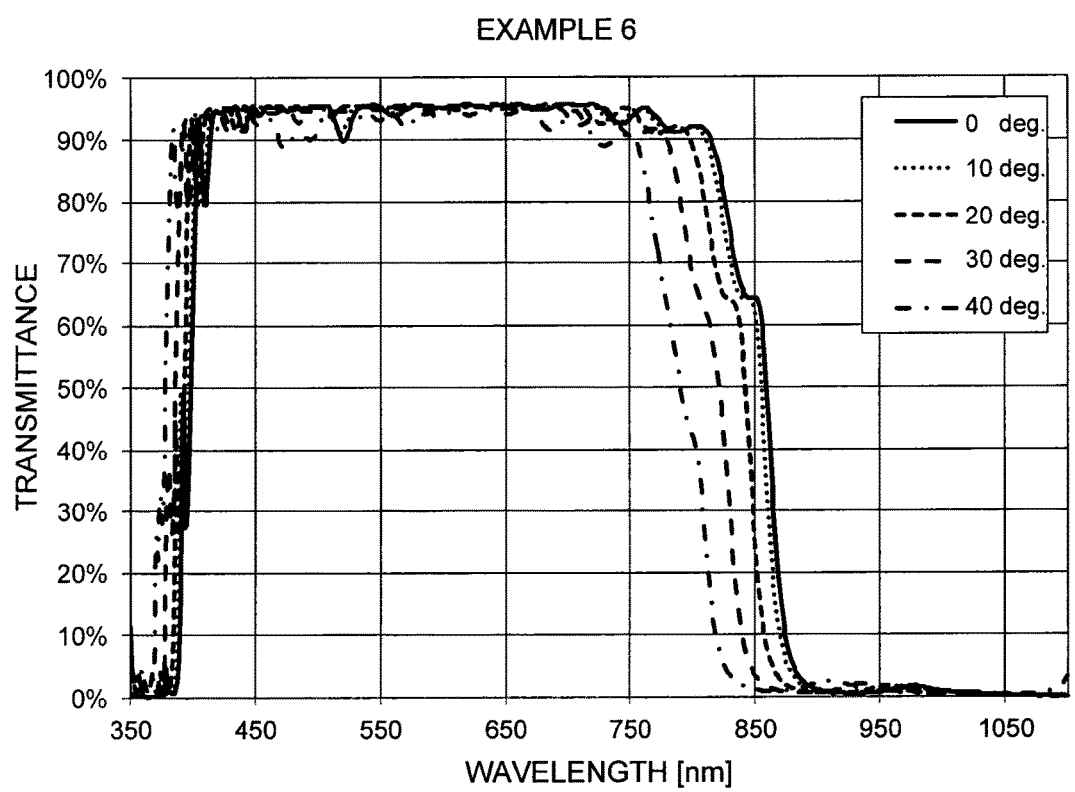
FIG. 19 is a view illustrating spectral transmittance characteristics of a near-infrared cut filter in Example 6.
Figure 20:
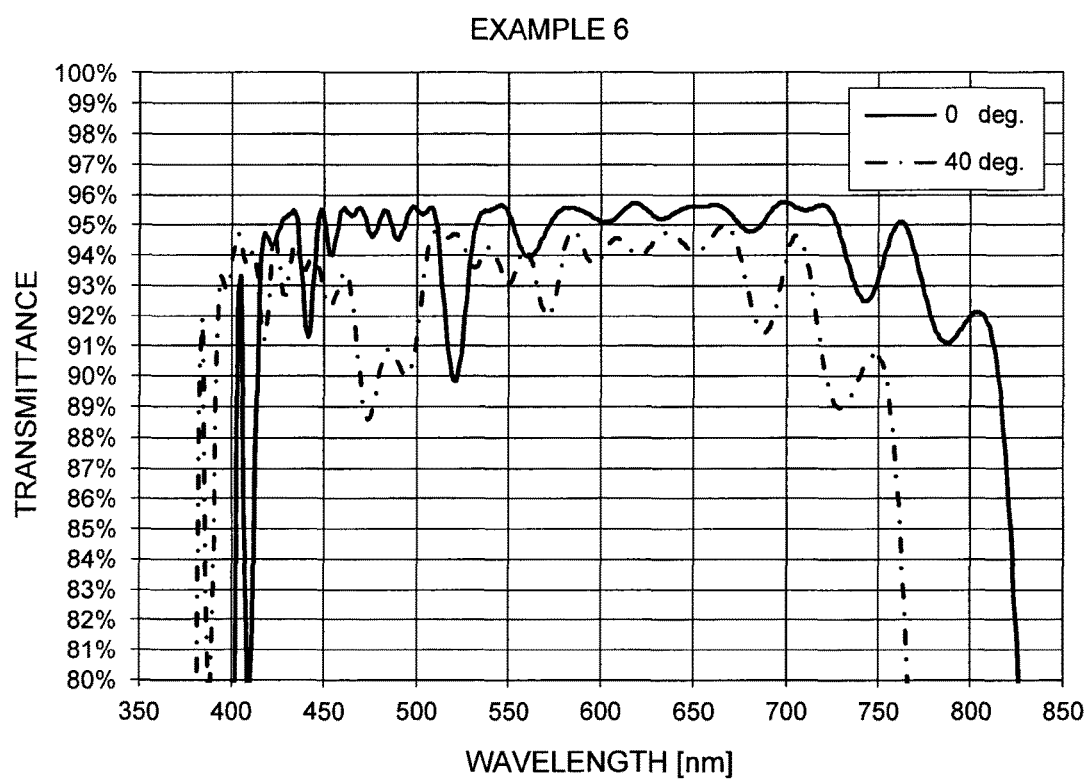
FIG. 20 is a partial enlarged view of the spectral transmittance characteristics illustrated in FIG. 19.
Figure 21:
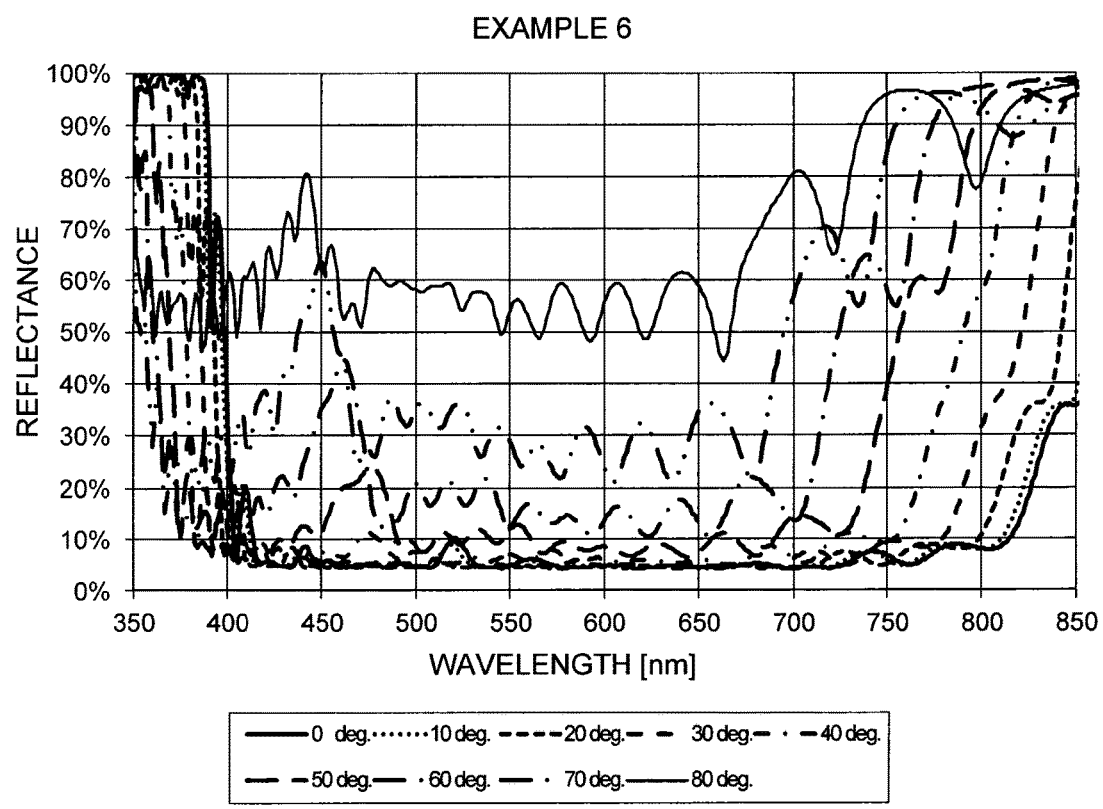
FIG. 21 is a view illustrating spectral reflectance characteristics of the near-infrared cut filter in Example 6.
Figure 22:
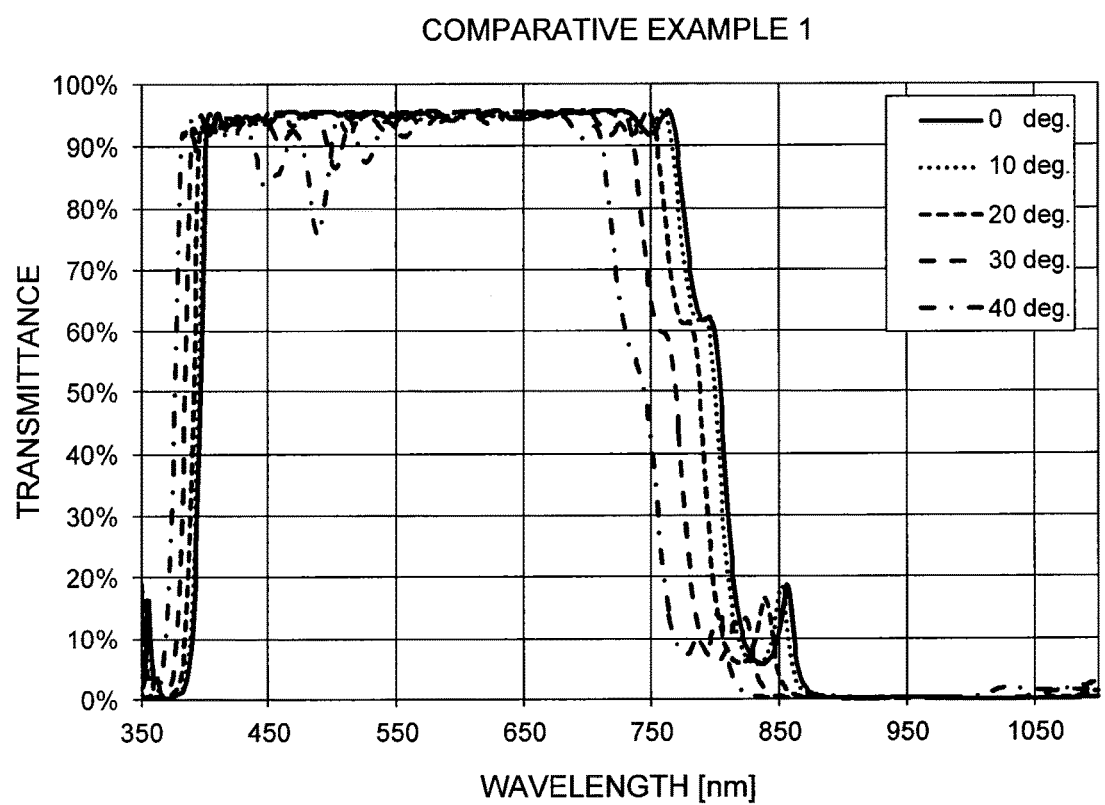
FIG. 22 is a view illustrating spectral transmittance characteristics of a near-infrared cut filter in Comparative example 1.
Figure 23:
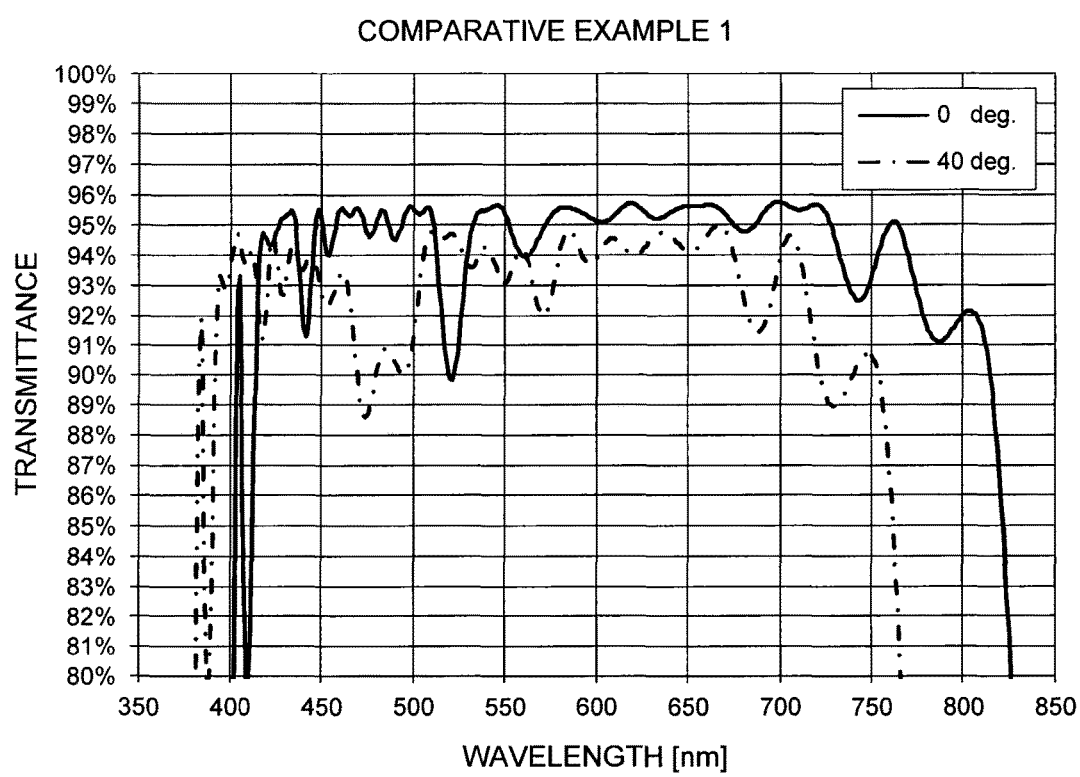
FIG. 23 is a partial enlarged view of the spectral transmittance characteristics illustrated in FIG. 22.
Figure 24:
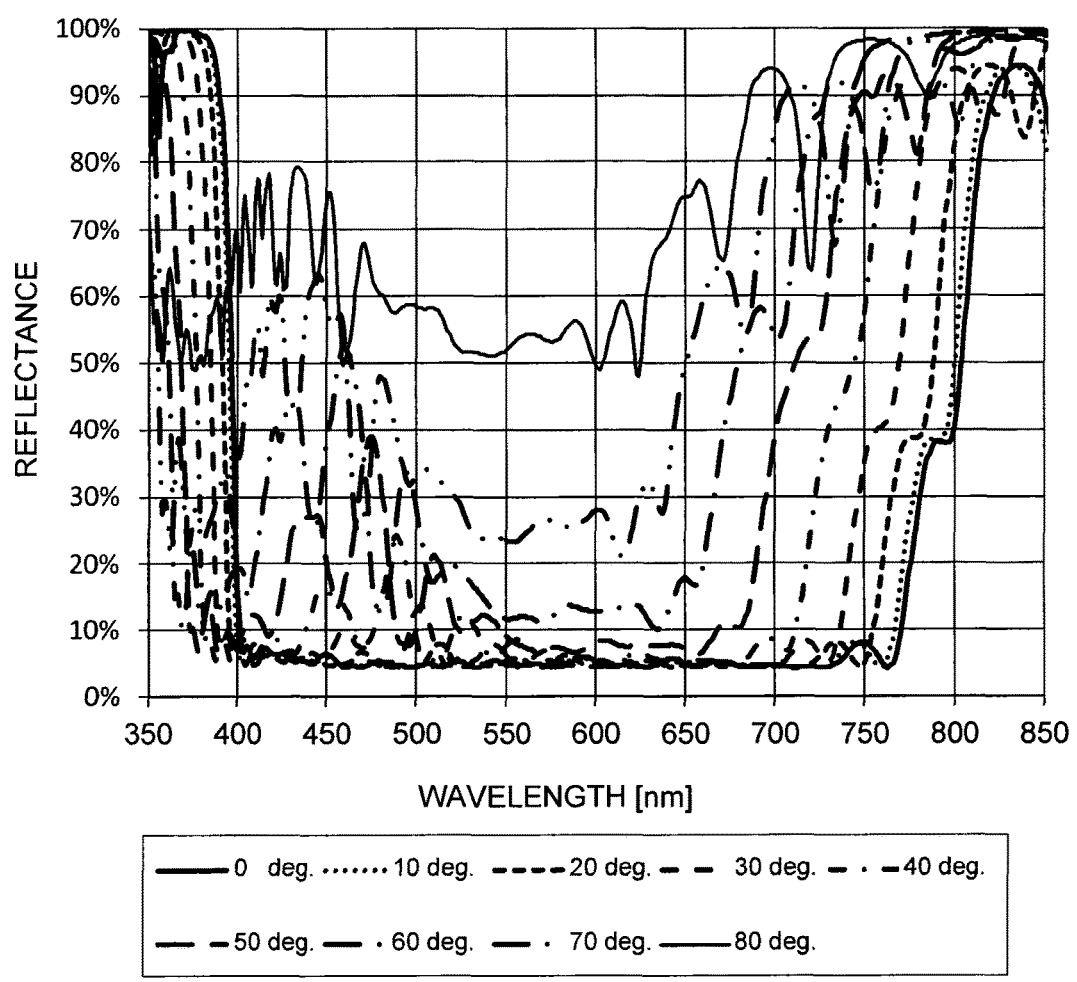
FIG. 24 is a view illustrating spectral reflectance characteristics of the near-infrared cut filter in Comparative example 1.
Figure 25:
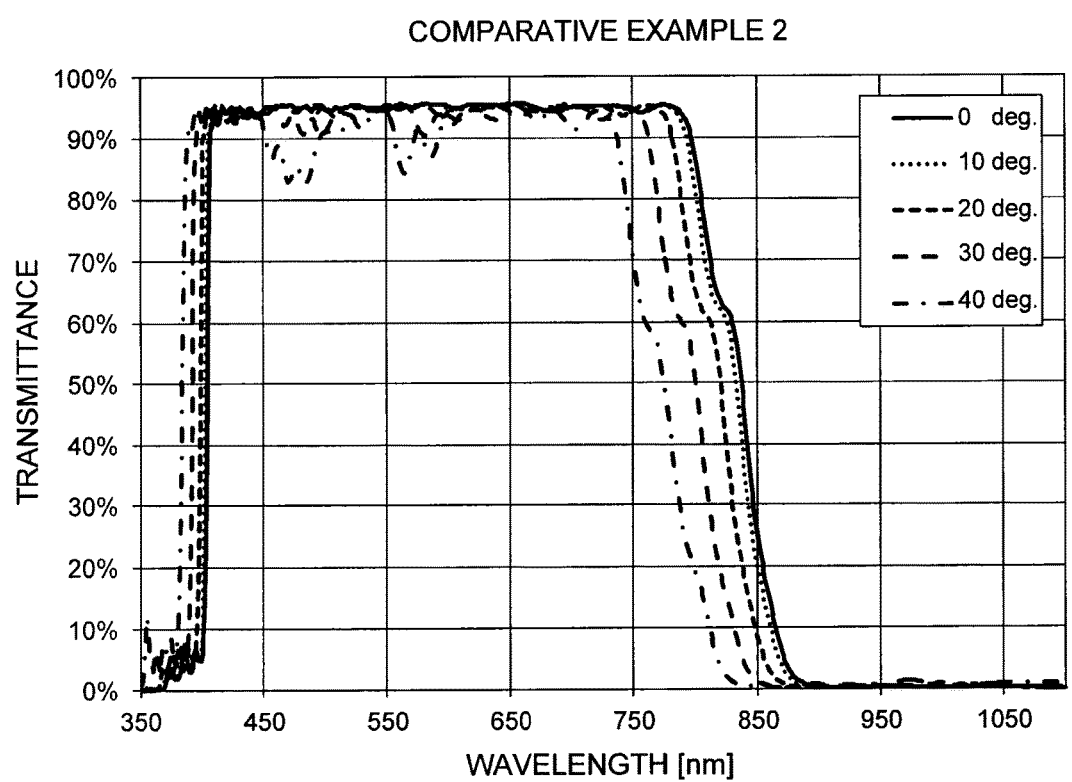
FIG. 25 is a view illustrating spectral transmittance characteristics of a near-infrared cut filter in Comparative example 2.
Figure 26:
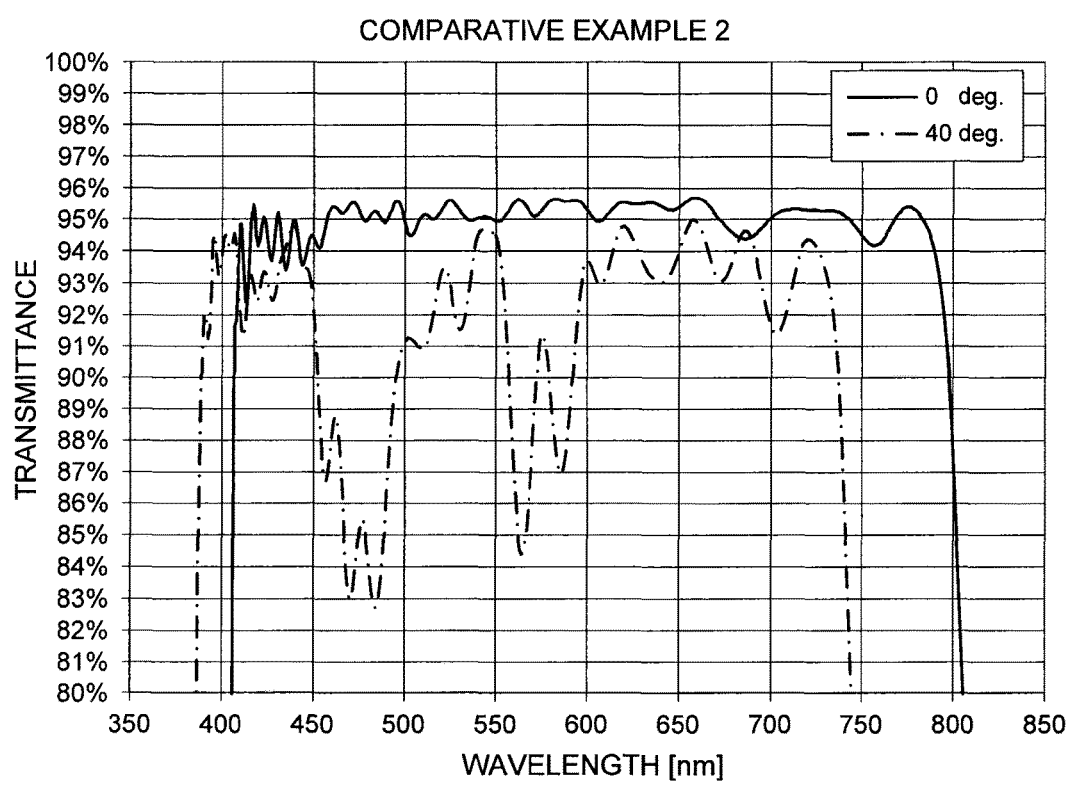
FIG. 26 is a partial enlarged view of the spectral transmittance characteristics illustrated in FIG. 25.
Figure 27:
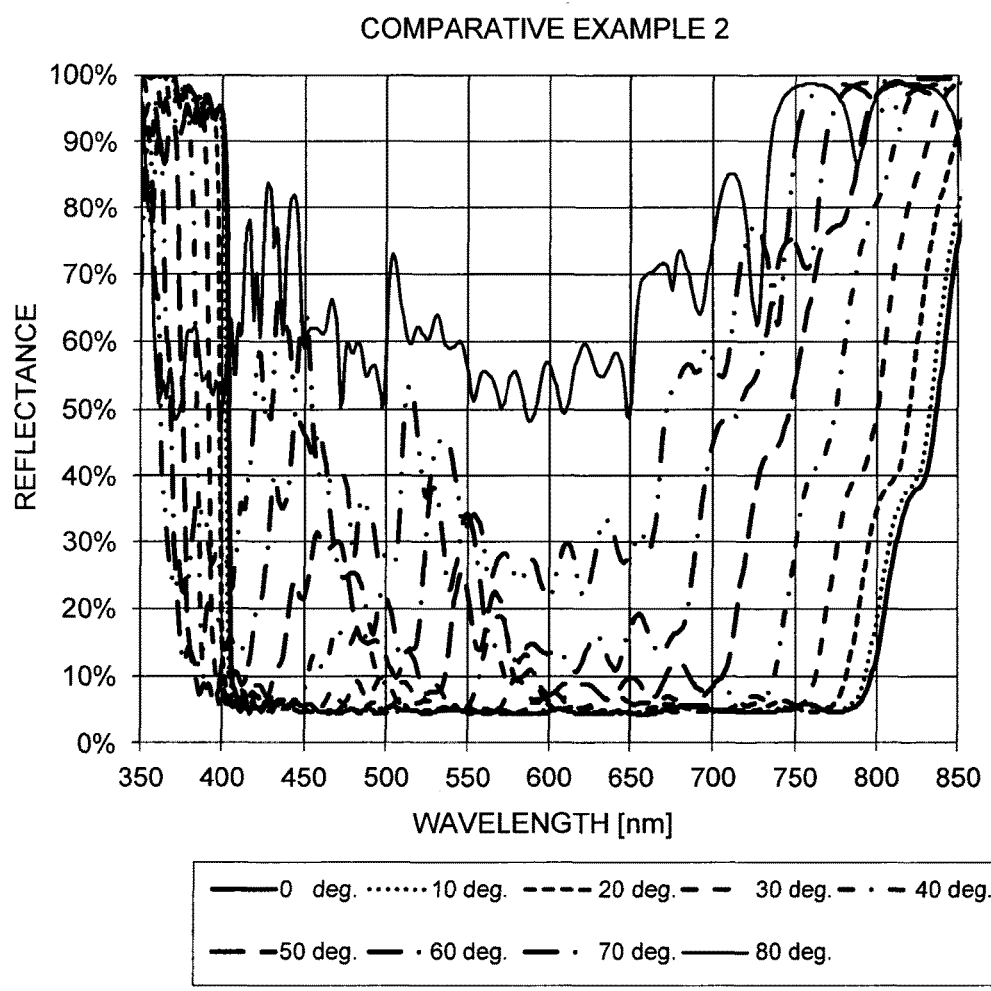
FIG. 27 is a view illustrating spectral reflectance characteristics of the near-infrared cut filter in Comparative example 2.
Figure 28:
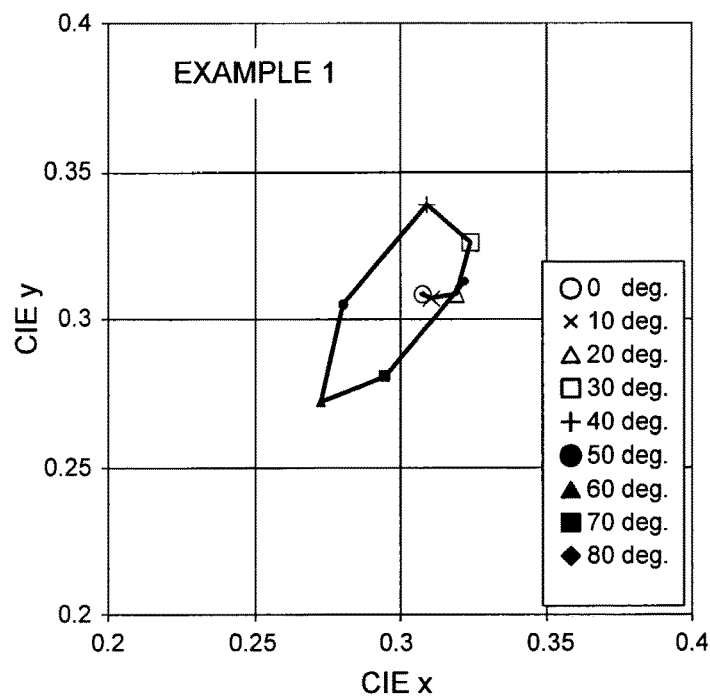
FIG. 28 is a view illustrating a chromaticity change in reflected color in the near-infrared cut filter in Example 1.
Figure 29:
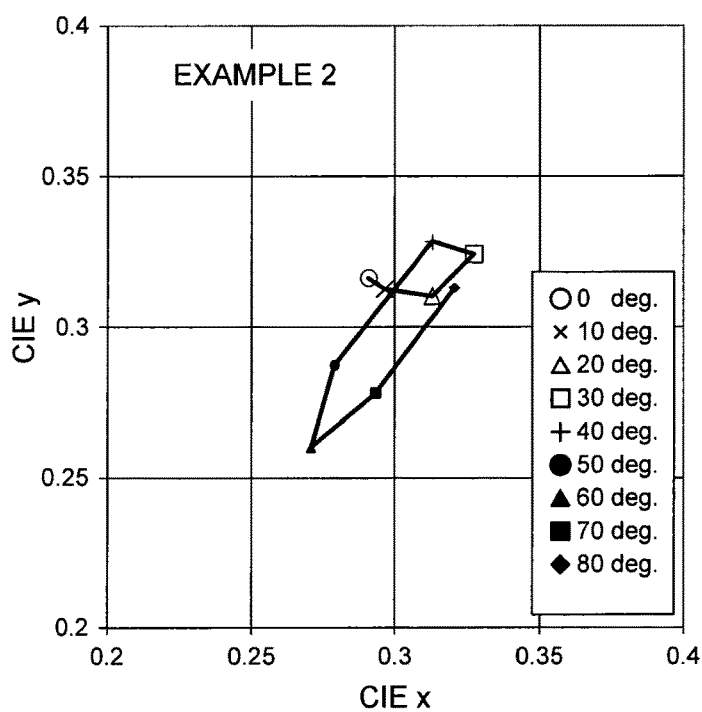
FIG. 29 is a view illustrating a chromaticity change in reflected color in the near-infrared cut filter in Example 2.
Figure 30:
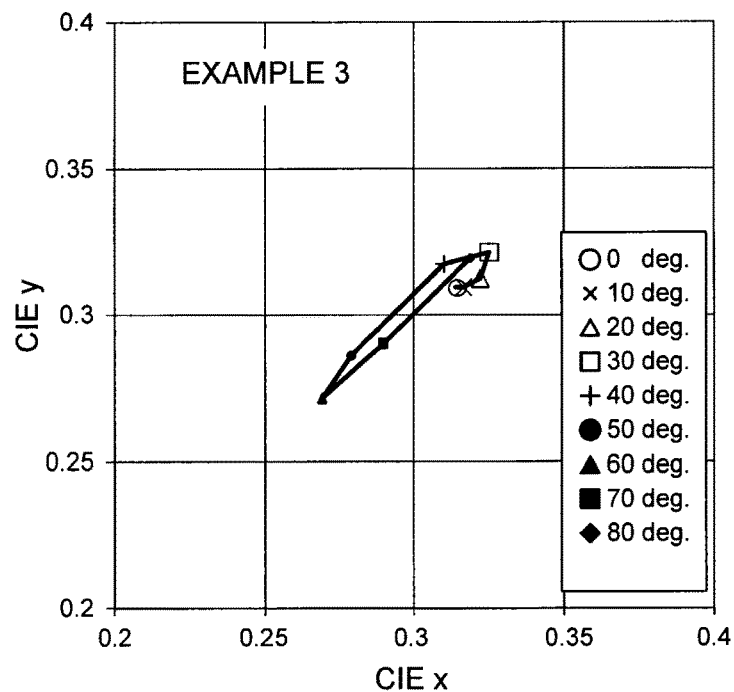
FIG. 30 is a view illustrating a chromaticity change in reflected color in the near-infrared cut filter in Example 3.
Figure 31:
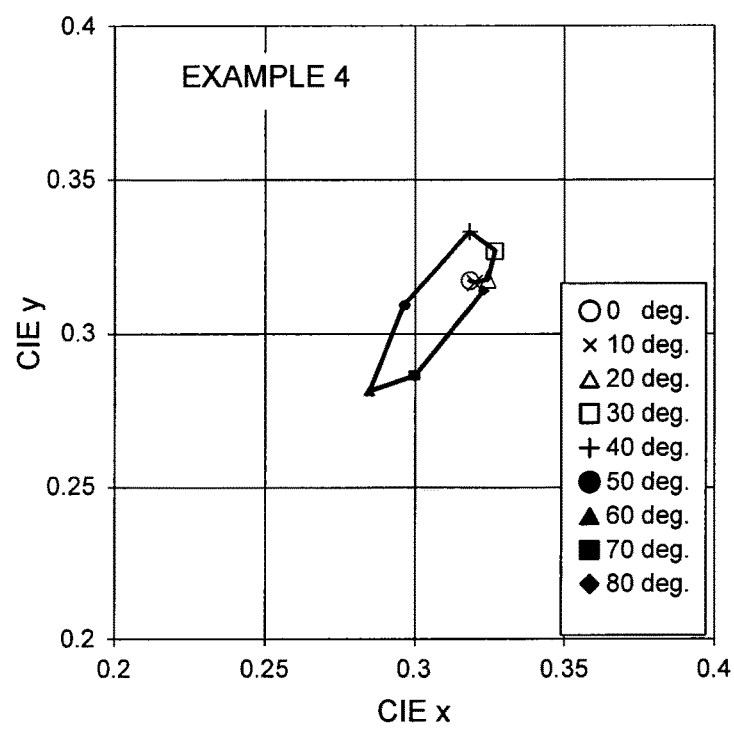
FIG. 31 is a view illustrating a chromaticity change in reflected color in the near-infrared cut filter in Example 4.
Figure 32:
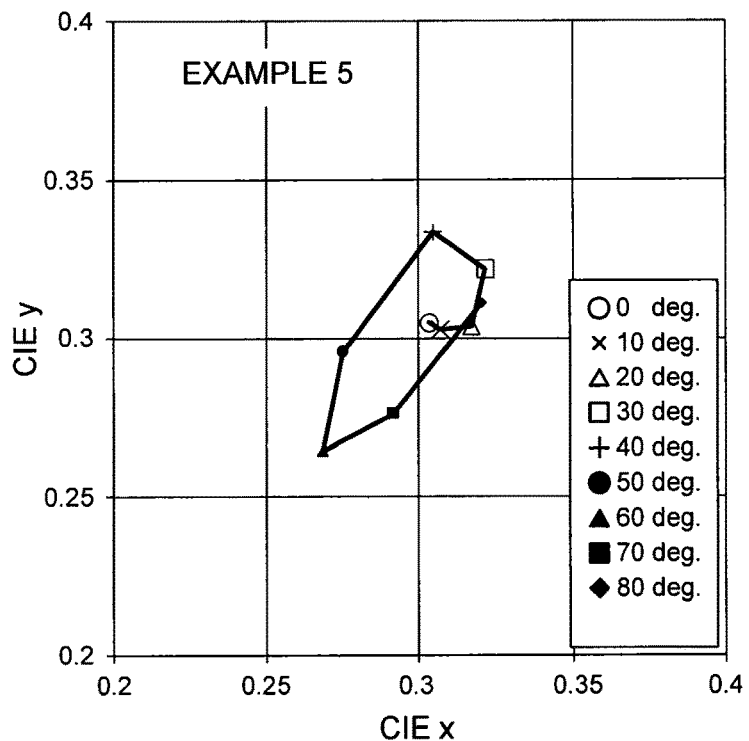
FIG. 32 is a view illustrating a chromaticity change in reflected color in the near-infrared cut filter in Example 5.
Figure 33:
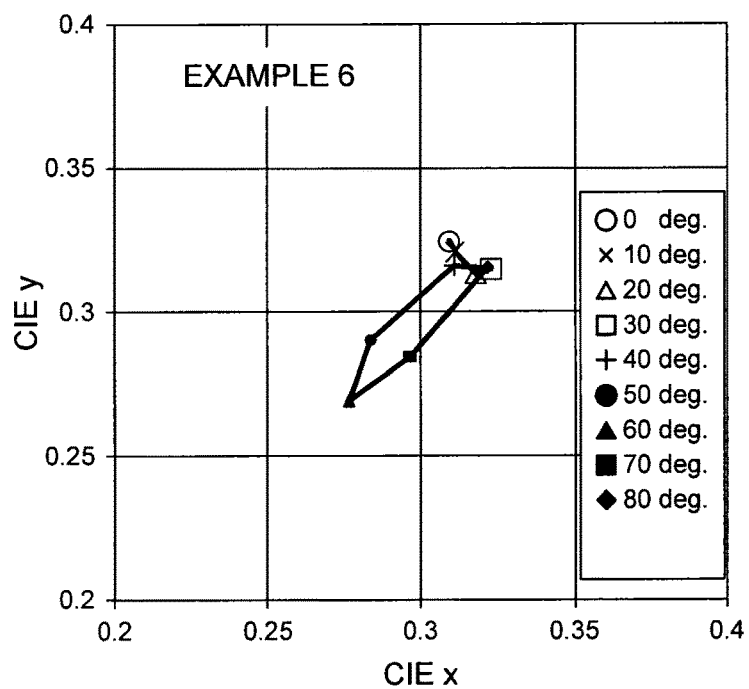
FIG. 33 is a view illustrating a chromaticity change in reflected color in the near-infrared cut filter in Example 6.
Figure 34:
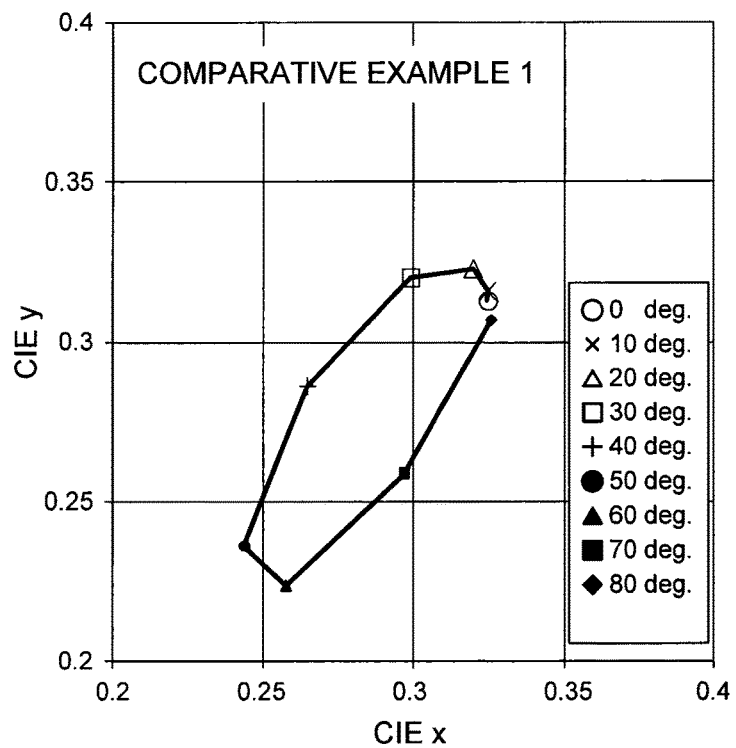
FIG. 34 is a view illustrating a chromaticity change in reflected color in the near-infrared cut filter in Comparative example 1.
Figure 35:
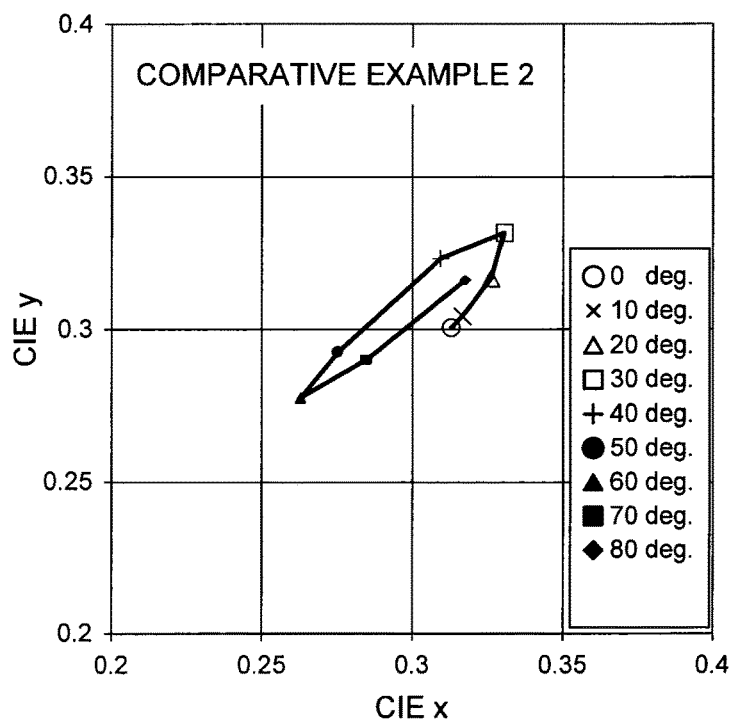
FIG. 35 is a view illustrating a chromaticity change in reflected color in the near-infrared cut filter in Comparative example 2.

FIG. 3 is a constitution view illustrating one embodiment of an imaging device to which the near-infrared cut filter 10 is applied.

An imaging device 100 includes, for example, a cover glass 110, a lens group 120, a diaphragm 130, a low-pass filter 140, a solid-state image sensing device 150, and a housing 160. The cover glass 110, the lens group 120, the diaphragm 130, the low-pass filter 140, and the solid-state image sensing device 150 are disposed along an optical axis.

The cover glass 110 is disposed on the imaging plane side (lens group 120 side) of the solid-state image sensing device 150 to protect the solid-state image sensing device 150 from the external environment.

The lens group 120 is disposed on the imaging plane side of the solid-state image sensing device 150. The lens group 120 is composed of a plurality of lenses L1 and L2 and guides light incident thereon to the imaging plane of the solid-state image sensing device 150.

The diaphragm 130 is disposed between the lens L1 and the lens L2 of the lens group 120. The diaphragm 130 is constituted to be able to adjust the amount of light passing therethrough.

The low-pass filter 140 is disposed between the lens group 120 and the solid-state image sensing device 150. The low-pass filter 140 suppresses moire and a false color.

The solid-state image sensing device 150 is, for example, a Charge Coupled Device (CCD) image sensor or a Complementary Metal Oxide Semiconductor (CMOS) image sensor. The solid-state image sensing device 150 converts inputted light to an electric signal and outputs the signal to a not-illustrated image signal processing circuit.

The housing 160 houses the lens group 120, the diaphragm 130, the low-pass filter 140, and the solid-state image sensing device 150 therein.

In the imaging device 100, light incident thereon from an object side passes through the cover glass 110, the lens group 120, the diaphragm 130, and the low-pass filter 140, and is made incident on the solid-state image sensing device 150. The incident light is converted by the solid-state image sensing device 150 to an electric signal, which is outputted as an image signal.

The near-infrared cut filter 10 is used, for example, as the cover glass 110 or the lens group 120, namely, the lenses L1 and L2, or the low-pass filter 140. In other words, the optical multilayer film 12 of the near-infrared cut filter 10 is provided on the surface of the transparent substrate 11 that constitutes the cover glass, the lens group, or the low-pass filter of the conventional imaging device.

Applying the near-infrared cut filter 10 to the cover glass 110, the lens group 120, or the low-pass filter 140 makes it possible to suppress excessive occurrence of a ripple and excessive change in reflected color regardless of the incident angle, and to improve a characteristic and appearance.

Incidentally, the application range of the near-infrared cut filter 10 is not necessarily limited to the cover glass 110, the lens group 120, or the low-pass filter 140. For example, the near-infrared cut filter 10 may be provided independently of them, or may also be directly pasted on the solid-state image sensing device or its package.

The imaging device 100 described above is used by being disposed inside an electronic apparatus having an imaging function, for example. The electronic apparatus includes, for example an apparatus main body and the imaging device 100, of which at least one portion is housed inside this apparatus main body and the other portion is disposed by being exposed externally, which is not illustrated. The imaging device 100 is housed in the apparatus main body in a manner that the cover glass 110 is exposed externally, for example.

When the cover glass 110 is exposed externally, this cover glass 110 can be visually recognized from the outside, so that the appearance needs to be good. Applying the near-infrared cut filter 10 of the embodiment to the cover glass 110 described above makes it possible to suppress excessive occurrence of a ripple regardless of the incident angle of light to obtain good imaging quality, and to suppress excessive change in reflected color regardless of the incident angle of light to improve the appearance.

As the electronic apparatus, a mobile phone, a smartphone, a digital still camera, a digital video camera, a monitoring camera, a camera for automobile use, a web camera, and the like can be cited. Among them, mobile electronic apparatuses such as a mobile phone, a smartphone, and a digital still camera can be cited as a preferable one, and particularly, the mobile phone and the smartphone are preferable.

EXAMPLES

Next, specific explanations will be made while referring to examples.

Example 1

Near-infrared cut filters were each made by a transparent substrate (white plate glass having a thickness of 0.45 mm) and an optical multilayer film provided on one principal surface of this transparent substrate. The optical multilayer films were each made to have a structure in which niobium oxide (a high refractive-index film having a refractive index at the wavelength of 500 nm of 2.38) and silicon oxide (a low refractive-index film having a refractive index at the wavelength of 500 nm of 1.46) are stacked alternately as illustrated in Table 1. Incidentally, in Tables, the layer number indicates a layer number from the transparent substrate side.

TABLE 1

| Example 1 | | | |
|---|---|---|---|
| Layer number | Film material | Physical film thickness [nm] | Optical film thickness ratio L |
| 1 | $Nb_2O_5$ | 8.43 | 0.469 |
| 2 | $SiO_2$ | 29.3 | |
| 3 | $Nb_2O_5$ | 22.6 | 2.924 |
| 4 | $SiO_2$ | 12.6 | |
| 5 | $Nb_2O_5$ | 81.9 | 7.459 |
| 6 | $SiO_2$ | 17.9 | |
| 7 | $Nb_2O_5$ | 21.6 | 0.187 |
| 8 | $SiO_2$ | 187.8 | |
| 9 | $Nb_2O_5$ | 18.9 | 1.988 |
| 10 | $SiO_2$ | 15.5 | |
| 11 | $Nb_2O_5$ | 78.4 | 8.245 |
| 12 | $SiO_2$ | 15.5 | |
| 13 | $Nb_2O_5$ | 17.8 | 0.168 |
| 14 | $SiO_2$ | 173.2 | |
| 15 | $Nb_2O_5$ | 16.8 | 1.565 |
| 16 | $SiO_2$ | 17.5 | |
| 17 | $Nb_2O_5$ | 79.8 | 6.994 |
| 18 | $SiO_2$ | 18.6 | |
| 19 | $Nb_2O_5$ | 20.7 | 0.154 |
| 20 | $SiO_2$ | 218.9 | |
| 21 | $Nb_2O_5$ | 20.9 | 1.132 |
| 22 | $SiO_2$ | 30.1 | |
| 23 | $Nb_2O_5$ | 104.8 | 15.531 |
| 24 | $SiO_2$ | 11 | |
| 25 | $Nb_2O_5$ | 21.6 | 0.185 |
| 26 | $SiO_2$ | 190.1 | |
| 27 | $Nb_2O_5$ | 113.1 | 0.990 |
| 28 | $SiO_2$ | 186.3 | |
| 29 | $Nb_2O_5$ | 112.8 | 0.984 |
| 30 | $SiO_2$ | 186.9 | |
| 31 | $Nb_2O_5$ | 112.8 | 1.009 |
| 32 | $SiO_2$ | 182.3 | |
| 33 | $Nb_2O_5$ | 108.8 | 1.003 |
| 34 | $SiO_2$ | 176.9 | |
| 35 | $Nb_2O_5$ | 103.3 | 0.973 |

TABLE 1-continued

| Example 1 | | | |
|---|---|---|---|
| Layer number | Film material | Physical film thickness [nm] | Optical film thickness ratio L |
| 36 | $SiO_2$ | 173 | |
| 37 | $Nb_2O_5$ | 103 | 0.969 |
| 38 | $SiO_2$ | 173.3 | |
| 39 | $Nb_2O_5$ | 24.1 | 4.832 |
| 40 | $SiO_2$ | 8.13 | |
| 41 | $Nb_2O_5$ | 56.85 | 5.583 |
| 42 | $SiO_2$ | 16.6 | |
| 43 | $Nb_2O_5$ | 14 | 0.143 |
| 44 | $SiO_2$ | 159.1 | |
| 45 | $Nb_2O_5$ | 20.3 | 1.808 |
| 46 | $SiO_2$ | 18.3 | |
| 47 | $Nb_2O_5$ | 73.4 | 4.638 |
| 48 | $SiO_2$ | 25.8 | |
| 49 | $Nb_2O_5$ | 21.75 | 0.160 |
| 50 | $SiO_2$ | 221.3 | |
| 51 | $Nb_2O_5$ | 20.4 | 1.409 |
| 52 | $SiO_2$ | 23.6 | |
| 53 | $Nb_2O_5$ | 72.3 | 7.678 |
| 54 | $SiO_2$ | 15.35 | |
| 55 | $Nb_2O_5$ | 20.7 | 0.186 |
| 56 | $SiO_2$ | 181.1 | |
| 57 | $Nb_2O_5$ | 28.9 | 2.972 |
| 58 | $SiO_2$ | 15.85 | |
| 59 | $Nb_2O_5$ | 42.6 | 13.278 |
| 60 | $SiO_2$ | 5.23 | |
| 61 | $Nb_2O_5$ | 12.6 | 0.228 |
| 62 | $SiO_2$ | 89.9 | |

Example 2

There were made near-infrared cut filters similar to those in Example 1 except that the constitution of each optical multilayer film was changed to a constitution illustrated in Table 2.

TABLE 2

| Example 2 | | | |
|---|---|---|---|
| Layer number | Film material | Physical film thickness [nm] | Optical film thickness ratio L |
| 1 | $Nb_2O_5$ | 9.29 | 0.257 |
| 2 | $SiO_2$ | 58.9 | |
| 3 | $Nb_2O_5$ | 10 | 0.089 |
| 4 | $SiO_2$ | 183.4 | |
| 5 | $Nb_2O_5$ | 12.3 | 0.802 |
| 6 | $SiO_2$ | 25 | |
| 7 | $Nb_2O_5$ | 86.5 | 8.494 |
| 8 | $SiO_2$ | 16.6 | |
| 9 | $Nb_2O_5$ | 13.7 | 0.151 |
| 10 | $SiO_2$ | 148.3 | |
| 11 | $Nb_2O_5$ | 16.7 | 1.680 |
| 12 | $SiO_2$ | 16.2 | |
| 13 | $Nb_2O_5$ | 72.9 | 3.495 |
| 14 | $SiO_2$ | 34 | |
| 15 | $Nb_2O_5$ | 12.7 | 0.212 |
| 16 | $SiO_2$ | 97.8 | |
| 17 | $Nb_2O_5$ | 15.4 | 1.674 |
| 18 | $SiO_2$ | 15 | |
| 19 | $Nb_2O_5$ | 87.5 | 0.824 |
| 20 | $SiO_2$ | 173 | |
| 21 | $Nb_2O_5$ | 102.4 | 0.980 |
| 22 | $SiO_2$ | 170.4 | |
| 23 | $Nb_2O_5$ | 100.7 | 0.956 |
| 24 | $SiO_2$ | 171.7 | |
| 25 | $Nb_2O_5$ | 103.5 | 0.969 |
| 26 | $SiO_2$ | 174.1 | |
| 27 | $Nb_2O_5$ | 105.5 | 0.967 |

TABLE 2-continued

Example 2

| Layer number | Film material | Physical film thickness [nm] | Optical film thickness ratio L |
|---|---|---|---|
| 28 | SiO$_2$ | 177.8 | |
| 29 | Nb$_2$O$_5$ | 105.9 | 0.966 |
| 30 | SiO$_2$ | 178.8 | |
| 31 | Nb$_2$O$_5$ | 107.1 | 0.963 |
| 32 | SiO$_2$ | 181.3 | |
| 33 | Nb$_2$O$_5$ | 110.3 | 0.953 |
| 34 | SiO$_2$ | 188.7 | |
| 35 | Nb$_2$O$_5$ | 117.8 | 6.020 |
| 36 | SiO$_2$ | 31.9 | |
| 37 | Nb$_2$O$_5$ | 15.1 | 0.139 |
| 38 | SiO$_2$ | 176.5 | |
| 39 | Nb$_2$O$_5$ | 13.9 | 0.713 |
| 40 | SiO$_2$ | 31.8 | |
| 41 | Nb$_2$O$_5$ | 113.8 | 8.319 |
| 42 | SiO$_2$ | 22.3 | |
| 43 | Nb$_2$O$_5$ | 10.8 | 0.108 |
| 44 | SiO$_2$ | 163.7 | |
| 45 | Nb$_2$O$_5$ | 14.1 | 1.393 |
| 46 | SiO$_2$ | 16.5 | |
| 47 | Nb$_2$O$_5$ | 82.2 | 11.754 |
| 48 | SiO$_2$ | 11.4 | |
| 49 | Nb$_2$O$_5$ | 15.2 | 0.148 |
| 50 | SiO$_2$ | 167.9 | |
| 51 | Nb$_2$O$_5$ | 9.61 | 1.178 |
| 52 | SiO$_2$ | 13.3 | |
| 53 | Nb$_2$O$_5$ | 100.8 | 1.804 |
| 54 | SiO$_2$ | 91.1 | |

Example 3

There were made near-infrared cut filters similar to those in Example 1 except that the constitution of each optical multilayer film was changed to a constitution illustrated in Table 3.

TABLE 3

Example 3

| Layer number | Film material | Physical film thickness [nm] | Optical film thickness ratio L |
|---|---|---|---|
| 1 | SiO$_2$ | 197.8 | |
| 2 | Nb$_2$O$_5$ | 19 | 1.147 |
| 3 | SiO$_2$ | 27 | |
| 4 | Nb$_2$O$_5$ | 75.5 | 6.444 |
| 5 | SiO$_2$ | 19.1 | |
| 6 | Nb$_2$O$_5$ | 24.4 | 0.193 |
| 7 | SiO$_2$ | 205.7 | |
| 8 | Nb$_2$O$_5$ | 22.7 | 1.814 |
| 9 | SiO$_2$ | 20.4 | |
| 10 | Nb$_2$O$_5$ | 62.3 | 4.836 |
| 11 | SiO$_2$ | 21 | |
| 12 | Nb$_2$O$_5$ | 23.8 | 0.192 |
| 13 | SiO$_2$ | 202.4 | |
| 14 | Nb$_2$O$_5$ | 22.1 | 1.601 |
| 15 | SiO$_2$ | 22.5 | |
| 16 | Nb$_2$O$_5$ | 69.5 | 5.126 |
| 17 | SiO$_2$ | 22.1 | |
| 18 | Nb$_2$O$_5$ | 23 | 0.185 |
| 19 | SiO$_2$ | 202.5 | |
| 20 | Nb$_2$O$_5$ | 20.7 | 1.679 |
| 21 | SiO$_2$ | 20.1 | |
| 22 | Nb$_2$O$_5$ | 78.8 | 7.299 |
| 23 | SiO$_2$ | 17.6 | |
| 24 | Nb$_2$O$_5$ | 20.8 | 0.179 |
| 25 | SiO$_2$ | 189.2 | |
| 26 | Nb$_2$O$_5$ | 21 | 1.979 |
| 27 | SiO$_2$ | 17.3 | |

TABLE 3-continued

Example 3

| Layer number | Film material | Physical film thickness [nm] | Optical film thickness ratio L |
|---|---|---|---|
| 28 | Nb$_2$O$_5$ | 74.6 | 6.367 |
| 29 | SiO$_2$ | 19.1 | |
| 30 | Nb$_2$O$_5$ | 19.4 | 0.161 |
| 31 | SiO$_2$ | 195.9 | |
| 32 | Nb$_2$O$_5$ | 22 | 1.692 |
| 33 | SiO$_2$ | 21.2 | |
| 34 | Nb$_2$O$_5$ | 71.3 | 5.670 |
| 35 | SiO$_2$ | 20.5 | |
| 36 | Nb$_2$O$_5$ | 23.8 | 0.199 |
| 37 | SiO$_2$ | 194.7 | |
| 38 | Nb$_2$O$_5$ | 19.7 | 1.774 |
| 39 | SiO$_2$ | 18.1 | |
| 40 | Nb$_2$O$_5$ | 71.4 | 8.314 |
| 41 | SiO$_2$ | 14 | |
| 42 | Nb$_2$O$_5$ | 21.7 | 0.193 |
| 43 | SiO$_2$ | 183.1 | |
| 44 | Nb$_2$O$_5$ | 20 | 2.885 |
| 45 | SiO$_2$ | 11.3 | |
| 46 | Nb$_2$O$_5$ | 56.2 | 9.777 |
| 47 | SiO$_2$ | 9.37 | |
| 48 | Nb$_2$O$_5$ | 25.3 | 0.224 |
| 49 | SiO$_2$ | 183.8 | |
| 50 | Nb$_2$O$_5$ | 107.6 | 0.974 |
| 51 | SiO$_2$ | 180 | |
| 52 | Nb$_2$O$_5$ | 106 | 0.989 |
| 53 | SiO$_2$ | 174.7 | |
| 54 | Nb$_2$O$_5$ | 103.8 | 0.975 |
| 55 | SiO$_2$ | 173.5 | |
| 56 | Nb$_2$O$_5$ | 102.5 | 0.973 |
| 57 | SiO$_2$ | 171.7 | |
| 58 | Nb$_2$O$_5$ | 103.4 | 0.963 |
| 59 | SiO$_2$ | 175.1 | |
| 60 | Nb$_2$O$_5$ | 101.1 | 2.005 |
| 61 | SiO$_2$ | 82.2 | |

Example 4

There were made near-infrared cut filters similar to those in Example 1 except that the transparent substrate was changed to a sapphire substrate (with a thickness of 0.3 mm) and the constitution of each optical multilayer film was changed to a constitution illustrated in Table 4.

TABLE 4

Example 4

| Layer number | Film material | Physical film thickness [nm] | Optical film thickness ratio L |
|---|---|---|---|
| 1 | Nb$_2$O$_5$ | 6.75 | 0.738 |
| 2 | SiO$_2$ | 14.9 | |
| 3 | Nb$_2$O$_5$ | 22.6 | 2.924 |
| 4 | SiO$_2$ | 12.6 | |
| 5 | Nb$_2$O$_5$ | 81.9 | 7.459 |
| 6 | SiO$_2$ | 17.9 | |
| 7 | Nb$_2$O$_5$ | 21.6 | 0.187 |
| 8 | SiO$_2$ | 187.8 | |
| 9 | Nb$_2$O$_5$ | 18.9 | 1.988 |
| 10 | SiO$_2$ | 15.5 | |
| 11 | Nb$_2$O$_5$ | 78.4 | 8.245 |
| 12 | SiO$_2$ | 15.5 | |
| 13 | Nb$_2$O$_5$ | 17.8 | 0.168 |
| 14 | SiO$_2$ | 173.2 | |
| 15 | Nb$_2$O$_5$ | 16.8 | 1.565 |
| 16 | SiO$_2$ | 17.5 | |
| 17 | Nb$_2$O$_5$ | 79.8 | 6.994 |
| 18 | SiO$_2$ | 18.6 | |
| 19 | Nb$_2$O$_5$ | 20.7 | 0.154 |

TABLE 4-continued

Example 4

| Layer number | Film material | Physical film thickness [nm] | Optical film thickness ratio L |
|---|---|---|---|
| 20 | SiO$_2$ | 218.9 | |
| 21 | Nb$_2$O$_5$ | 20.9 | 1.132 |
| 22 | SiO$_2$ | 30.1 | |
| 23 | Nb$_2$O$_5$ | 104.8 | 15.531 |
| 24 | SiO$_2$ | 11 | |
| 25 | Nb$_2$O$_5$ | 21.6 | 0.185 |
| 26 | SiO$_2$ | 190.1 | |
| 27 | Nb$_2$O$_5$ | 113.1 | 0.990 |
| 28 | SiO$_2$ | 186.3 | |
| 29 | Nb$_2$O$_5$ | 112.8 | 0.984 |
| 30 | SiO$_2$ | 186.9 | |
| 31 | Nb$_2$O$_5$ | 112.8 | 1.009 |
| 32 | SiO$_2$ | 182.3 | |
| 33 | Nb$_2$O$_5$ | 108.8 | 1.003 |
| 34 | SiO$_2$ | 176.9 | |
| 35 | Nb$_2$O$_5$ | 103.3 | 0.973 |
| 36 | SiO$_2$ | 173 | |
| 37 | Nb$_2$O$_5$ | 103 | 0.969 |
| 38 | SiO$_2$ | 173.3 | |
| 39 | Nb$_2$O$_5$ | 24.1 | 4.832 |
| 40 | SiO$_2$ | 8.13 | |
| 41 | Nb$_2$O$_5$ | 56.85 | 5.583 |
| 42 | SiO$_2$ | 16.6 | |
| 43 | Nb$_2$O$_5$ | 14 | 0.143 |
| 44 | SiO$_2$ | 159.1 | |
| 45 | Nb$_2$O$_5$ | 20.3 | 1.808 |
| 46 | SiO$_2$ | 18.3 | |
| 47 | Nb$_2$O$_5$ | 73.4 | 4.638 |
| 48 | SiO$_2$ | 25.8 | |
| 49 | Nb$_2$O$_5$ | 21.75 | 0.160 |
| 50 | SiO$_2$ | 221.3 | |
| 51 | Nb$_2$O$_5$ | 20.4 | 1.409 |
| 52 | SiO$_2$ | 23.6 | |
| 53 | Nb$_2$O$_5$ | 72.3 | 7.678 |
| 54 | SiO$_2$ | 15.35 | |
| 55 | Nb$_2$O$_5$ | 20.7 | 0.186 |
| 56 | SiO$_2$ | 181.1 | |
| 57 | Nb$_2$O$_5$ | 28.9 | 2.972 |
| 58 | SiO$_2$ | 15.85 | |
| 59 | Nb$_2$O$_5$ | 42.6 | 13.278 |
| 60 | SiO$_2$ | 5.23 | |
| 61 | Nb$_2$O$_5$ | 12.6 | 0.228 |
| 62 | SiO$_2$ | 89.9 | |

Example 5

There were made near-infrared cut filters similar to those in Example 1 except that each optical multilayer film was made to have a structure in which titanium oxide (a high refractive-index film having a refractive index at the wavelength of 500 nm of 2.47) and silicon oxide (a low refractive-index film having a refractive index at the wavelength of 500 nm of 1.46) are stacked alternately as illustrated in Table 5.

TABLE 5

Example 5

| Layer number | Film material | Physical film thickness [nm] | Optical film thickness ratio L |
|---|---|---|---|
| 1 | TiO$_2$ | 7.57 | 0.358 |
| 2 | SiO$_2$ | 34.5 | |
| 3 | TiO$_2$ | 21.8 | 2.652 |
| 4 | SiO$_2$ | 13.4 | |
| 5 | TiO$_2$ | 82.4 | 7.809 |
| 6 | SiO$_2$ | 17.2 | |
| 7 | TiO$_2$ | 18.5 | 0.169 |
| 8 | SiO$_2$ | 178.6 | |
| 9 | TiO$_2$ | 16.6 | 1.769 |
| 10 | SiO$_2$ | 15.3 | |
| 11 | TiO$_2$ | 79.8 | 8.130 |
| 12 | SiO$_2$ | 16 | |
| 13 | TiO$_2$ | 15.6 | 0.151 |
| 14 | SiO$_2$ | 168.1 | |
| 15 | TiO$_2$ | 16.8 | 1.565 |
| 16 | SiO$_2$ | 17.5 | |
| 17 | TiO$_2$ | 80.8 | 6.394 |
| 18 | SiO$_2$ | 20.6 | |
| 19 | TiO$_2$ | 19.6 | 0.146 |
| 20 | SiO$_2$ | 219 | |
| 21 | TiO$_2$ | 19.9 | 1.033 |
| 22 | SiO$_2$ | 31.4 | |
| 23 | TiO$_2$ | 105.1 | 16.163 |
| 24 | SiO$_2$ | 10.6 | |
| 25 | TiO$_2$ | 20 | 0.175 |
| 26 | SiO$_2$ | 186.5 | |
| 27 | TiO$_2$ | 107 | 0.975 |
| 28 | SiO$_2$ | 178.9 | |
| 29 | TiO$_2$ | 107.3 | 0.965 |
| 30 | SiO$_2$ | 181.3 | |
| 31 | TiO$_2$ | 109.7 | 0.981 |
| 32 | SiO$_2$ | 182.2 | |
| 33 | TiO$_2$ | 105.5 | 0.974 |
| 34 | SiO$_2$ | 176.6 | |
| 35 | TiO$_2$ | 100.9 | 0.968 |
| 36 | SiO$_2$ | 169.9 | |
| 37 | TiO$_2$ | 98.3 | 0.936 |
| 38 | SiO$_2$ | 171.2 | |
| 39 | TiO$_2$ | 23.7 | 5.264 |
| 40 | SiO$_2$ | 7.34 | |
| 41 | TiO$_2$ | 58.9 | 5.715 |
| 42 | SiO$_2$ | 16.8 | |
| 43 | TiO$_2$ | 11.3 | 0.120 |
| 44 | SiO$_2$ | 154.1 | |
| 45 | TiO$_2$ | 17.8 | 1.738 |
| 46 | SiO$_2$ | 16.7 | |
| 47 | TiO$_2$ | 76.5 | 5.049 |
| 48 | SiO$_2$ | 24.7 | |
| 49 | TiO$_2$ | 18.9 | 0.144 |
| 50 | SiO$_2$ | 213.7 | |
| 51 | TiO$_2$ | 18.9 | 1.295 |
| 52 | SiO$_2$ | 23.8 | |
| 53 | TiO$_2$ | 74.9 | 9.112 |
| 54 | SiO$_2$ | 13.4 | |
| 55 | TiO$_2$ | 21.1 | 0.191 |
| 56 | SiO$_2$ | 179.7 | |
| 57 | TiO$_2$ | 26 | 2.883 |
| 58 | SiO$_2$ | 14.7 | |
| 59 | TiO$_2$ | 44 | 10.951 |
| 60 | SiO$_2$ | 6.55 | |
| 61 | TiO$_2$ | 12.2 | 0.228 |
| 62 | SiO$_2$ | 87.2 | |

Example 6

There were made near-infrared cut filters similar to those in Example 1 except that each optical multilayer film was changed to a constitution illustrated in Table 6.

TABLE 6

Example 6

| Layer number | Film material | Physical film thickness [nm] | Optical film thickness ratio L |
|---|---|---|---|
| 1 | SiO$_2$ | 19.1 | |
| 2 | Nb$_2$O$_5$ | 17.3 | 0.959 |

TABLE 6-continued

Example 6

| Layer number | Film material | Physical film thickness [nm] | Optical film thickness ratio L |
|---|---|---|---|
| 3 | SiO$_2$ | 29.4 | |
| 4 | Nb$_2$O$_5$ | 96.9 | 12.245 |
| 5 | SiO$_2$ | 12.9 | |
| 6 | Nb$_2$O$_5$ | 18.6 | 0.167 |
| 7 | SiO$_2$ | 182.1 | |
| 8 | Nb$_2$O$_5$ | 15.4 | 1.992 |
| 9 | SiO$_2$ | 12.6 | |
| 10 | Nb$_2$O$_5$ | 107.8 | 4.612 |
| 11 | SiO$_2$ | 38.1 | |
| 12 | Nb$_2$O$_5$ | 16.5 | 0.110 |
| 13 | SiO$_2$ | 243.6 | |
| 14 | Nb$_2$O$_5$ | 13.8 | 0.650 |
| 15 | SiO$_2$ | 34.6 | |
| 16 | Nb$_2$O$_5$ | 93.9 | 13.915 |
| 17 | SiO$_2$ | 11 | |
| 18 | Nb$_2$O$_5$ | 15.5 | 0.156 |
| 19 | SiO$_2$ | 161.7 | |
| 20 | Nb$_2$O$_5$ | 11.5 | 2.033 |
| 21 | SiO$_2$ | 9.22 | |
| 22 | Nb$_2$O$_5$ | 83.4 | 21.144 |
| 23 | SiO$_2$ | 6.43 | |
| 24 | Nb$_2$O$_5$ | 9.02 | 0.088 |
| 25 | SiO$_2$ | 167.3 | |
| 26 | Nb$_2$O$_5$ | 104 | 0.974 |
| 27 | SiO$_2$ | 174 | |
| 28 | Nb$_2$O$_5$ | 106.9 | 0.985 |
| 29 | SiO$_2$ | 176.9 | |
| 30 | Nb$_2$O$_5$ | 107.6 | 0.965 |
| 31 | SiO$_2$ | 181.7 | |
| 32 | Nb$_2$O$_5$ | 110.8 | 0.967 |
| 33 | SiO$_2$ | 186.7 | |
| 34 | Nb$_2$O$_5$ | 110 | 1.021 |
| 35 | SiO$_2$ | 175.6 | |
| 36 | Nb$_2$O$_5$ | 6.1 | 0.915 |
| 37 | SiO$_2$ | 10.8 | |
| 38 | Nb$_2$O$_5$ | 101.8 | 10.307 |
| 39 | SiO$_2$ | 16.1 | |
| 40 | Nb$_2$O$_5$ | 10.3 | 0.089 |
| 41 | SiO$_2$ | 189.2 | |
| 42 | Nb$_2$O$_5$ | 21.1 | 1.703 |
| 43 | SiO$_2$ | 20.2 | |
| 44 | Nb$_2$O$_5$ | 94.1 | 7.305 |
| 45 | SiO$_2$ | 21 | |
| 46 | Nb$_2$O$_5$ | 18.8 | 0.182 |
| 47 | SiO$_2$ | 168.1 | |
| 48 | Nb$_2$O$_5$ | 11.1 | 0.742 |
| 49 | SiO$_2$ | 24.4 | |
| 50 | Nb$_2$O$_5$ | 97.6 | 9.882 |
| 51 | SiO$_2$ | 16.1 | |
| 52 | Nb$_2$O$_5$ | 13.9 | 0.136 |
| 53 | SiO$_2$ | 16.7 | |
| 54 | Nb$_2$O$_5$ | 10.5 | 1.001 |
| 55 | SiO$_2$ | 17.1 | |
| 56 | Nb$_2$O$_5$ | 100.4 | 1.823 |
| 57 | SiO$_2$ | 89.8 | |

Comparative Example 1

There were made near-infrared cut filters similar to those in Example 1 except that the constitution of each optical multilayer film was changed to a constitution illustrated in Table 7. Incidentally, the near-infrared cut filter of Comparative example 1 is one in which thicknesses of respective films were fine-adjusted by performing evaluation of occurrence of a ripple only with the incident angle set to 0 degree and not performing evaluation of occurrence of a ripple with the incident angle set to 40 degrees.

TABLE 7

Comparative example 1

| Layer number | Film material | Physical film thickness [nm] | Optical film thickness ratio L |
|---|---|---|---|
| 1 | Nb$_2$O$_5$ | 10 | 0.580 |
| 2 | SiO$_2$ | 28.1 | |
| 3 | Nb$_2$O$_5$ | 19.1 | 4.950 |
| 4 | SiO$_2$ | 6.29 | |
| 5 | Nb$_2$O$_5$ | 60.1 | 7.775 |
| 6 | SiO$_2$ | 12.6 | |
| 7 | Nb$_2$O$_5$ | 21.7 | 0.222 |
| 8 | SiO$_2$ | 159 | |
| 9 | Nb$_2$O$_5$ | 14.8 | 1.774 |
| 10 | SiO$_2$ | 13.6 | |
| 11 | Nb$_2$O$_5$ | 56.8 | 7.982 |
| 12 | SiO$_2$ | 11.6 | |
| 13 | Nb$_2$O$_5$ | 21.1 | 0.244 |
| 14 | SiO$_2$ | 140.9 | |
| 15 | Nb$_2$O$_5$ | 7.84 | 0.825 |
| 16 | SiO$_2$ | 15.5 | |
| 17 | Nb$_2$O$_5$ | 60.4 | 10.519 |
| 18 | SiO$_2$ | 9.36 | |
| 19 | Nb$_2$O$_5$ | 21.4 | 0.236 |
| 20 | SiO$_2$ | 148.1 | |
| 21 | Nb$_2$O$_5$ | 12.4 | 2.080 |
| 22 | SiO$_2$ | 9.72 | |
| 23 | Nb$_2$O$_5$ | 84.3 | 0.836 |
| 24 | SiO$_2$ | 164.4 | |
| 25 | Nb$_2$O$_5$ | 102.1 | 1.012 |
| 26 | SiO$_2$ | 164.5 | |
| 27 | Nb$_2$O$_5$ | 101.7 | 0.963 |
| 28 | SiO$_2$ | 172.1 | |
| 29 | Nb$_2$O$_5$ | 107.9 | 0.995 |
| 30 | SiO$_2$ | 176.7 | |
| 31 | Nb$_2$O$_5$ | 113.1 | 0.988 |
| 32 | SiO$_2$ | 186.6 | |
| 33 | Nb$_2$O$_5$ | 112.1 | 1.017 |
| 34 | SiO$_2$ | 179.6 | |
| 35 | Nb$_2$O$_5$ | 112.6 | 1.042 |
| 36 | SiO$_2$ | 176.1 | |
| 37 | Nb$_2$O$_5$ | 12.2 | 2.648 |
| 38 | SiO$_2$ | 7.5 | |
| 39 | Nb$_2$O$_5$ | 82.9 | 16.767 |
| 40 | SiO$_2$ | 8.06 | |
| 41 | Nb$_2$O$_5$ | 19.1 | 0.163 |
| 42 | SiO$_2$ | 191 | |
| 43 | Nb$_2$O$_5$ | 27.2 | 2.737 |
| 44 | SiO$_2$ | 16.2 | |
| 45 | Nb$_2$O$_5$ | 82.2 | 5.360 |
| 46 | SiO$_2$ | 25 | |
| 47 | Nb$_2$O$_5$ | 21.2 | 0.184 |
| 48 | SiO$_2$ | 188.2 | |
| 49 | Nb$_2$O$_5$ | 14.5 | 1.182 |
| 50 | SiO$_2$ | 20 | |
| 51 | Nb$_2$O$_5$ | 76.1 | 12.671 |
| 52 | SiO$_2$ | 9.79 | |
| 53 | Nb$_2$O$_5$ | 21.8 | 0.205 |
| 54 | SiO$_2$ | 173.7 | |
| 55 | Nb$_2$O$_5$ | 19.1 | 4.790 |
| 56 | SiO$_2$ | 6.5 | |
| 57 | Nb$_2$O$_5$ | 84.6 | 1.622 |
| 58 | SiO$_2$ | 85 | |

Comparative Example 2

There were made near-infrared cut filters similar to those in Example 1 except that the constitution of each optical multilayer film was changed to a constitution illustrated in Table 8. Incidentally, the near-infrared cut filter of Comparative example 2 is one in which thicknesses of respective films were fine-adjusted by performing evaluation of occurrence of a ripple only with the incident angle set to 0 degree and not performing evaluation of occurrence of a ripple with the incident angle set to 40 degrees.

TABLE 8

Comparative example 2

| Layer number | Film material | Physical film thickness [nm] | Optical film thickness ratio L |
|---|---|---|---|
| 1 | Nb$_2$O$_5$ | 14.34 | 0.728 |
| 2 | SiO$_2$ | 32.1 | |
| 3 | Nb$_2$O$_5$ | 119 | 7.354 |
| 4 | SiO$_2$ | 26.4 | |
| 5 | Nb$_2$O$_5$ | 10.2 | 0.099 |
| 6 | SiO$_2$ | 167.2 | |
| 7 | Nb$_2$O$_5$ | 16.9 | 0.588 |
| 8 | SiO$_2$ | 46.9 | |
| 9 | Nb$_2$O$_5$ | 18.3 | 0.297 |
| 10 | SiO$_2$ | 100.7 | |
| 11 | Nb$_2$O$_5$ | 8.6 | 0.270 |
| 12 | SiO$_2$ | 52.1 | |
| 13 | Nb$_2$O$_5$ | 110.2 | 1.037 |
| 14 | SiO$_2$ | 173.2 | |
| 15 | Nb$_2$O$_5$ | 105.9 | 1.028 |
| 16 | SiO$_2$ | 167.9 | |
| 17 | Nb$_2$O$_5$ | 102.1 | 0.989 |
| 18 | SiO$_2$ | 168.4 | |
| 19 | Nb$_2$O$_5$ | 104.4 | 1.005 |
| 20 | SiO$_2$ | 169.4 | |
| 21 | Nb$_2$O$_5$ | 105 | 0.987 |
| 22 | SiO$_2$ | 173.4 | |
| 23 | Nb$_2$O$_5$ | 110.4 | 0.982 |
| 24 | SiO$_2$ | 183.3 | |
| 25 | Nb$_2$O$_5$ | 114.1 | 1.012 |
| 26 | SiO$_2$ | 183.7 | |
| 27 | Nb$_2$O$_5$ | 108.3 | 14.005 |
| 28 | SiO$_2$ | 12.6 | |
| 29 | Nb$_2$O$_5$ | 9 | 0.079 |
| 30 | SiO$_2$ | 186.6 | |
| 31 | Nb$_2$O$_5$ | 28.4 | 3.329 |
| 32 | SiO$_2$ | 13.9 | |
| 33 | Nb$_2$O$_5$ | 94.5 | 5.295 |
| 34 | SiO$_2$ | 29.1 | |
| 35 | Nb$_2$O$_5$ | 20.1 | 0.225 |
| 36 | SiO$_2$ | 146 | |
| 37 | Nb$_2$O$_5$ | 8.2 | 0.309 |
| 38 | SiO$_2$ | 43.5 | |
| 39 | Nb$_2$O$_5$ | 106.8 | 14.205 |
| 40 | SiO$_2$ | 12.3 | |
| 41 | Nb$_2$O$_5$ | 13.6 | 0.128 |
| 42 | SiO$_2$ | 172.9 | |
| 43 | Nb$_2$O$_5$ | 13.8 | 1.527 |
| 44 | SiO$_2$ | 14.7 | |
| 45 | Nb$_2$O$_5$ | 103.7 | 7.289 |
| 46 | SiO$_2$ | 23.2 | |
| 47 | Nb$_2$O$_5$ | 12.1 | 0.116 |
| 48 | SiO$_2$ | 170.8 | |
| 49 | Nb$_2$O$_5$ | 20.7 | 1.685 |
| 50 | SiO$_2$ | 20 | |
| 51 | Nb$_2$O$_5$ | 107.7 | 7.204 |
| 52 | SiO$_2$ | 24.4 | |
| 53 | Nb$_2$O$_5$ | 18.2 | 0.181 |
| 54 | SiO$_2$ | 164.1 | |
| 55 | Nb$_2$O$_5$ | 13.1 | 0.775 |
| 56 | SiO$_2$ | 27.6 | |
| 57 | Nb$_2$O$_5$ | 102.5 | 9.644 |
| 58 | SiO$_2$ | 17.3 | |
| 59 | Nb$_2$O$_5$ | 16.5 | 0.165 |
| 60 | SiO$_2$ | 162.6 | |
| 61 | Nb$_2$O$_5$ | 8.3 | 0.586 |
| 62 | SiO$_2$ | 23.1 | |
| 63 | Nb$_2$O$_5$ | 109.5 | 1.862 |
| 64 | SiO$_2$ | 95.9 | |

Spectral characteristics of the near-infrared cut filters of Examples and Comparative examples when the incident angle was changed were obtained by using self-produced optical thin film simulation software and commercially available software (TFCalc, manufactured by Software Spectra Inc.).

FIG. 4 to FIG. 27 illustrate spectral characteristics of the respective near-infrared cut filters of Examples and Comparative examples. Incidentally, the spectral characteristics of the respective near-infrared cut filters of Examples and Comparative examples were illustrated in the order of spectral transmittance characteristics (of the wavelength range of 350 nm to 1050 nm and the wavelength range of 350 nm to 850 nm) and spectral reflectance characteristics (350 nm to 850 nm). Here, a spectral reflectance means a reflectance with respect to light incident from the transparent substrate side.

Table 9 illustrates, of the respective near-infrared cut filters of Examples and Comparative examples, mean transmittances $T_1$ and $T_3$ of the wavelength range of 450 nm to 700 nm, a minimum transmittance $T_7$ out of a transmittance $T_2$ and a minimum transmittance $T_8$ out of a transmittance $T_4$ of the wavelength range of 450 nm or more to less than 550 nm, and a difference ($T_1-T_7$) between the mean transmittance $T_1$ and the minimum transmittance $T_7$ and a difference ($T_3-T_8$) between the mean transmittance $T_3$ and the minimum transmittance $T_8$ when the incident angle is 0 degree and 40 degrees. Table 10 illustrates, of the respective near-infrared cut filters of Examples and Comparative examples, half-value wavelengths when the incident angle is 0 degree and 40 degrees. Table 11 illustrates, of the respective near-infrared cut filters of Examples and Comparative examples, mean transmittances of the wavelength range of 870 nm to 1100 nm when the incident angle is 0 degree, 10 degrees, 20 degrees, 30 degrees, and 40 degrees.

TABLE 9

| | Incident angle | Mean transmittance $T_1,T_3$ (450 nm to 700 nm) | Minimum transmittance $T_7,T_8$ (450 nm ≤ 550 nm>) | Difference $(T_1-T_7)$, $(T_3-T_8)$ |
|---|---|---|---|---|
| Example 1 | 0 degree | 95.0% | 92.6% | 2.4% |
| | 40 degrees | 93.4% | 88.0% | 5.4% |
| Example 2 | 0 degree | 94.5% | 88.9% | 5.6% |
| | 40 degrees | 93.1% | 89.1% | 4.0% |
| Example 3 | 0 degree | 94.7% | 92.2% | 2.5% |
| | 40 degrees | 93.6% | 88.5% | 5.1% |
| Example 4 | 0 degree | 91.7% | 90.0% | 1.7% |
| | 40 degrees | 90.1% | 85.6% | 4.6% |
| Example 5 | 0 degree | 94.9% | 92.7% | 2.2% |
| | 40 degrees | 93.2% | 86.6% | 6.6% |
| Example 6 | 0 degree | 95.0% | 89.9% | 5.1% |
| | 40 degrees | 93.3% | 88.6% | 4.7% |
| Comparative example 1 | 0 degree | 95.2% | 93.6% | 1.6% |
| | 40 degrees | 91.9% | 75.7% | 16.2% |
| Comparative example 2 | 0 degree | 95.2% | 94.1% | 1.1% |
| | 40 degrees | 91.2% | 82.7% | 8.5% |

TABLE 10

Half-value wavelength [nm]

| | Incident angle 0 degree | | Incident angle 40 degrees | |
|---|---|---|---|---|
| | Ultraviolet side | Infrared side | Ultraviolet side | Infrared side |
| Example 1 | 402 | 819 | 381 | 759 |
| Example 2 | 398 | 829 | 378 | 769 |
| Example 3 | 394 | 840 | 373 | 778 |
| Example 4 | 402 | 820 | 381 | 760 |
| Example 5 | 402 | 815 | 384 | 758 |
| Example 6 | 398 | 860 | 378 | 790 |
| Comparative example 1 | 397 | 804 | 377 | 744 |
| Comparative example 2 | 405 | 837 | 384 | 774 |

TABLE 11

|  |  | Incident angle | | | | |
|---|---|---|---|---|---|---|
|  |  | 0 degree | 10 degrees | 20 degrees | 30 degrees | 40 degrees |
| Mean transmittance (870 nm to 1100 nm) | Example 1 | 1.92% | 1.49% | 0.89% | 0.66% | 0.97% |
|  | Example 2 | 0.11% | 0.09% | 0.09% | 0.39% | 1.12% |
|  | Example 3 | 1.48% | 1.24% | 0.81% | 0.63% | 0.91% |
|  | Example 4 | 1.94% | 1.47% | 0.85% | 0.64% | 1.00% |
|  | Example 5 | 1.94% | 1.47% | 0.85% | 0.64% | 1.00% |
|  | Example 6 | 1.26% | 1.01% | 0.72% | 0.68% | 0.97% |
|  | Comparative example 1 | 0.15% | 0.13% | 0.17% | 0.36% | 0.80% |
|  | Comparative example 2 | 0.47% | 0.37% | 0.28% | 0.35% | 0.70% |

Further, Tables 12 to 14 illustrate, of the respective near-infrared cut filters of Examples and Comparative examples, mean reflectances of blue, green, and red, and chromaticity (x, y) calculated in a CIE1931 color system. Further, the chromaticity (x, y) in Tables 12 to 14 is illustrated in FIG. 28 to FIG. 35. The chromaticity (x, y) is chromaticity with respect to reflection when viewed from the transparent substrate side.

Incidentally, in the present invention, the refractive indices of the transparent substrate and the respective films at the wavelength of 500 nm are used as representative values, but, wavelength dependence of the refractive indices were considered in the simulations. The refractive index has wavelength dependence called dispersion or the like. For example, in a wavelength range of 300 nm to 1300 nm, there is a tendency that the refractive index is higher as the wavelength is shorter and the refractive index decreases as the wavelength increases, in the transparent substrate material, film materials, and the like that are used in the present invention. The wavelength-refractive index relationship is not a linear relationship.

TABLE 12

|  |  | Mean reflectance | | | | | |
|---|---|---|---|---|---|---|---|
|  |  | Blue | Green | Red | | | |
|  | Incident angle | [430 nm to 515 nm] | [515 nm to 595 nm] | [595 nm to 680 nm] | CIE 1931 x | y | Reflected color |
| Example 1 | 0 deg. | 5.6% | 5.0% | 4.7% | 0.307 | 0.308 | Achromatic color (White) |
|  | 10 deg. | 5.5% | 4.9% | 4.7% | 0.311 | 0.307 | Achromatic color (White) |
|  | 20 deg. | 5.1% | 4.6% | 4.6% | 0.319 | 0.308 | Achromatic color (White) |
|  | 30 deg. | 5.2% | 5.1% | 4.8% | 0.324 | 0.326 | Achromatic color (White) |
|  | 40 deg. | 7.6% | 6.5% | 5.6% | 0.309 | 0.339 | Achromatic color (White) |
|  | 50 deg. | 14.3% | 9.7% | 7.8% | 0.280 | 0.305 | Achromatic color (White) |
|  | 60 deg. | 25.6% | 15.1% | 13.9% | 0.273 | 0.272 | Achromatic color (White) |
|  | 70 deg. | 40.8% | 27.8% | 30.2% | 0.295 | 0.281 | Achromatic color (White) |
|  | 80 deg. | 62.4% | 53.2% | 59.5% | 0.322 | 0.313 | Achromatic color (White) |
| Example 2 | 0 deg. | 7.0% | 5.3% | 4.8% | 0.291 | 0.317 | Achromatic color (White) |
|  | 10 deg. | 6.6% | 5.2% | 4.8% | 0.297 | 0.313 | Achromatic color (White) |
|  | 20 deg. | 5.8% | 5.1% | 4.9% | 0.313 | 0.310 | Achromatic color (White) |
|  | 30 deg. | 5.5% | 5.4% | 5.2% | 0.327 | 0.325 | Achromatic color (White) |
|  | 40 deg. | 7.6% | 7.1% | 6.0% | 0.313 | 0.328 | Achromatic color (White) |
|  | 50 deg. | 14.4% | 10.6% | 8.1% | 0.279 | 0.288 | Achromatic color (White) |
|  | 60 deg. | 26.4% | 16.7% | 13.6% | 0.271 | 0.260 | Achromatic color (White) |
|  | 70 deg. | 40.6% | 28.0% | 29.2% | 0.293 | 0.278 | Achromatic color (White) |
|  | 80 deg. | 62.0% | 54.8% | 57.9% | 0.321 | 0.313 | Achromatic color (White) |
| Example 3 | 0 deg. | 5.9% | 4.9% | 5.0% | 0.314 | 0.310 | Achromatic color (White) |
|  | 10 deg. | 5.7% | 4.8% | 4.9% | 0.317 | 0.310 | Achromatic color (White) |
|  | 20 deg. | 5.2% | 4.7% | 4.9% | 0.322 | 0.313 | Achromatic color (White) |
|  | 30 deg. | 5.3% | 4.8% | 4.9% | 0.325 | 0.322 | Achromatic color (White) |
|  | 40 deg. | 7.5% | 6.2% | 5.4% | 0.310 | 0.318 | Achromatic color (White) |
|  | 50 deg. | 13.6% | 9.4% | 7.2% | 0.279 | 0.286 | Achromatic color (White) |
|  | 60 deg. | 23.4% | 16.6% | 12.0% | 0.269 | 0.272 | Achromatic color (White) |
|  | 70 deg. | 37.5% | 28.3% | 25.9% | 0.290 | 0.290 | Achromatic color (White) |
|  | 80 deg. | 59.0% | 54.4% | 55.1% | 0.319 | 0.320 | Achromatic color (White) |

TABLE 13

| | | Mean reflectance | | | CIE 1931 | | |
| | Incident angle | Blue [430 nm to 515 nm] | Green [515 nm to 595 nm] | Red [595 nm to 680 nm] | x | y | Reflected color |
|---|---|---|---|---|---|---|---|
| Example 4 | 0 deg. | 9.0% | 8.3% | 8.0% | 0.318 | 0.317 | Achromatic color (White) |
| | 10 deg. | 8.8% | 8.2% | 8.0% | 0.320 | 0.317 | Achromatic color (White) |
| | 20 deg. | 8.5% | 8.0% | 8.0% | 0.324 | 0.318 | Achromatic color (White) |
| | 30 deg. | 8.5% | 8.3% | 8.2% | 0.327 | 0.327 | Achromatic color (White) |
| | 40 deg. | 10.9% | 9.6% | 9.0% | 0.318 | 0.333 | Achromatic color (White) |
| | 50 deg. | 17.3% | 12.7% | 11.3% | 0.296 | 0.309 | Achromatic color (White) |
| | 60 deg. | 28.1% | 18.1% | 17.4% | 0.285 | 0.281 | Achromatic color (White) |
| | 70 deg. | 42.6% | 30.3% | 33.1% | 0.300 | 0.286 | Achromatic color (White) |
| | 80 deg. | 63.3% | 54.7% | 60.9% | 0.323 | 0.314 | Achromatic color (White) |
| Example 5 | 0 deg. | 5.7% | 5.0% | 4.8% | 0.303 | 0.305 | Achromatic color (White) |
| | 10 deg. | 5.5% | 4.8% | 4.8% | 0.307 | 0.303 | Achromatic color (White) |
| | 20 deg. | 5.2% | 4.6% | 4.7% | 0.317 | 0.304 | Achromatic color (White) |
| | 30 deg. | 5.3% | 5.1% | 4.8% | 0.322 | 0.322 | Achromatic color (White) |
| | 40 deg. | 8.3% | 6.4% | 5.8% | 0.305 | 0.333 | Achromatic color (White) |
| | 50 deg. | 15.7% | 9.7% | 7.9% | 0.275 | 0.296 | Achromatic color (White) |
| | 60 deg. | 27.3% | 15.7% | 14.8% | 0.268 | 0.264 | Achromatic color (White) |
| | 70 deg. | 42.3% | 28.5% | 30.6% | 0.291 | 0.276 | Achromatic color (White) |
| | 80 deg. | 63.5% | 53.9% | 59.0% | 0.321 | 0.311 | Achromatic color (White) |
| Example 6 | 0 deg. | 5.2% | 5.6% | 4.6% | 0.309 | 0.325 | Achromatic color (White) |
| | 10 deg. | 5.3% | 5.3% | 4.6% | 0.311 | 0.321 | Achromatic color (White) |
| | 20 deg. | 5.3% | 4.7% | 4.7% | 0.318 | 0.313 | Achromatic color (White) |
| | 30 deg. | 5.4% | 4.9% | 4.8% | 0.323 | 0.315 | Achromatic color (White) |
| | 40 deg. | 7.8% | 6.2% | 5.7% | 0.311 | 0.316 | Achromatic color (White) |
| | 50 deg. | 14.0% | 9.7% | 8.2% | 0.284 | 0.290 | Achromatic color (White) |
| | 60 deg. | 24.7% | 16.0% | 14.9% | 0.276 | 0.269 | Achromatic color (White) |
| | 70 deg. | 39.8% | 28.8% | 28.1% | 0.297 | 0.284 | Achromatic color (White) |
| | 80 deg. | 62.0% | 54.5% | 56.1% | 0.322 | 0.315 | Achromatic color (White) |

TABLE 14

| | | Mean reflectance | | | CIE 1931 | | |
| | Incident angle | Blue [430 nm to 515 nm] | Green [515 nm to 595 nm] | Red [595 nm to 680 nm] | x | y | Reflected color |
|---|---|---|---|---|---|---|---|
| Comparative example 1 | 0 deg. | 4.9% | 4.9% | 4.9% | 0.325 | 0.313 | Achromatic color (White) |
| | 10 deg. | 4.9% | 5.0% | 4.8% | 0.325 | 0.316 | Achromatic color (White) |
| | 20 deg. | 5.5% | 5.2% | 4.7% | 0.320 | 0.323 | Achromatic color (White) |
| | 30 deg. | 7.5% | 5.6% | 4.9% | 0.299 | 0.320 | Achromatic color (White) |
| | 40 deg. | 12.2% | 7.3% | 5.5% | 0.265 | 0.286 | Achromatic color (White) |
| | 50 deg. | 21.6% | 9.1% | 8.1% | 0.244 | 0.236 | Achromatic color (White) |
| | 60 deg. | 31.0% | 14.0% | 19.2% | 0.258 | 0.224 | Achromatic color (White) |
| | 70 deg. | 42.8% | 25.7% | 40.4% | 0.297 | 0.259 | Achromatic color (White) |
| | 80 deg. | 63.0% | 53.2% | 64.5% | 0.326 | 0.307 | Achromatic color (White) |
| Comparative example 2 | 0 deg. | 5.1% | 4.7% | 4.7% | 0.313 | 0.301 | Achromatic color (White) |
| | 10 deg. | 5.1% | 4.7% | 4.8% | 0.316 | 0.304 | Achromatic color (White) |
| | 20 deg. | 5.3% | 5.0% | 5.1% | 0.326 | 0.317 | Achromatic color (White) |
| | 30 deg. | 6.7% | 6.1% | 5.6% | 0.331 | 0.331 | Achromatic color (White) |
| | 40 deg. | 10.9% | 9.2% | 6.2% | 0.309 | 0.323 | Achromatic color (White) |
| | 50 deg. | 19.3% | 14.2% | 8.5% | 0.275 | 0.293 | Achromatic color (White) |
| | 60 deg. | 30.0% | 22.3% | 14.3% | 0.263 | 0.277 | Achromatic color (White) |
| | 70 deg. | 43.1% | 33.7% | 31.5% | 0.284 | 0.290 | Achromatic color (White) |
| | 80 deg. | 63.4% | 56.1% | 60.0% | 0.318 | 0.316 | Achromatic color (White) |

As is clear from the above-described results, in the near-infrared cut filter of Examples, the difference obtained by subtracting the transmittance from the mean transmittance becomes 7.0% or less regardless of the incident angle, resulting in that the excessive occurrence of a ripple is suppressed. Further, in the near-infrared cut filter of Examples, the excessive change in reflected color is suppressed regardless of the incident angle. On the other hand, in the near-infrared cut filter of Comparative examples, a ripple is suppressed when the incident angle is small, but when the incident angle increases, a large ripple such that the difference obtained by subtracting the transmittance from the mean transmittance exceeds 7.0% occurs.

The above are obtained as a result that adjustment was performed at the incident angles of 0 degree and 40 degrees, but it is also possible to suppress excessive occurrence of a ripple and excessive change in reflected color by performing adjustment at an incident angle different from the incident angles of 0 degree and 40 degrees, (which is, for example, 45 degrees).

What is claimed is:

1. A near-infrared cut filter, comprising:
a transparent substrate; and
an optical multilayer film formed on the transparent substrate and comprising a plurality of high-refractive index films each having a refractive index at a wavelength of 500 nm in a range of 2.0 to 2.8 and a plurality of low-refractive index films each having a refractive index at the wavelength of 500 nm of less than 1.6,
wherein the optical multilayer film has a structure formed such that the high-refractive index films and the low-refractive index films are alternately stacked and that a spectral transmittance characteristic of the near-infrared cut filter has a transmittance of 85% or more for the entire wavelength range of 450 nm to 550 nm and at least a part of the wavelength range of 450 nm to 550 nm in which a difference obtained by subtracting the transmittance from a mean transmittance of a wavelength range of 450 nm to 700 nm is 1.65% or more for an incident light having an incident angle of 0 degree, and at least a part of the wavelength range of 450 nm to 550 nm in which a difference obtained by subtracting a transmittance from a mean transmittance of the wavelength range of 450 nm to 700 nm is 3.5% or more and the entire wavelength range of 450 nm to 550 nm in which a difference obtained by subtracting the transmittance from the mean transmittance of the wavelength range of 450 nm to 700 nm is 7.0% or less for an incident light having an incident angle of 40 degrees,
wherein the structure of the optical multilayer film has a plurality of stack units formed such that each of the stack units is constituted of one of the high-refractive index films and one of the low-refractive index films stacked adjacent to the one of the high-refractive index films on a side opposite to a transparent substrate side, and the plurality of stack units includes two stack units or less between a stack unit closest to the transparent substrate and a stack unit farthest from the transparent substrate such that each of the two stack units or less has an optical film thickness ratio L of greater than 0.22 to less than 0.50 obtained by expression $L=L_1/L_2$ where $L_1$ is an optical film thickness of a high-refractive index film and $L_2$ is an optical film thickness of a low-refractive index film in each of the two stack units or less.

2. The near-infrared cut filter according to claim 1, wherein the spectral transmittance characteristic of the near-infrared cut filter has the transmittance of 88% or more in the entire region of the wavelength range of 450 nm or more to less than 550 nm for the incident light having the incident angle of 0 degree.

3. The near-infrared cut filter according to claim 2, wherein the spectral transmittance characteristic of the near-infrared cut filter has a transmittance of 92% or more in the entire region of a wavelength range of not less than 550 nm nor more than 700 nm for the incident light having the incident angle of 0 degree.

4. The near-infrared cut filter according to claim 2, wherein the spectral transmittance characteristic of the near-infrared cut filter has a mean transmittance of 3% or less for the incident light having an incident angle in a range of 0 degree to 40 degrees in a wavelength range of 870 nm to 1100 nm.

5. The near-infrared cut filter according to claim 2, wherein the spectral transmittance characteristic of the near-infrared cut filter has a half-value wavelength on an ultraviolet side that is 405 nm to 350 nm, and a half-value wavelength on a near-infrared side that is 750 nm to 900 nm.

6. The near-infrared cut filter according to claim 2, wherein each of the high-refractive index films is made of titanium oxide or niobium oxide, and each of the low-refractive index films is made of silicon oxide.

7. The near-infrared cut filter according to claim 1, wherein the spectral transmittance characteristic of the near-infrared cut filter has a transmittance of 92% or more in the entire region of a wavelength range of not less than 550 nm nor more than 700 nm for the incident light having the incident angle of 0 degree.

8. The near-infrared cut filter according to claim 1, wherein the spectral transmittance characteristic of the near-infrared cut filter has a mean transmittance of 3% or less for the incident light having an incident angle in a range of 0 degree to 40 degrees in a wavelength range of 870 nm to 1100 nm.

9. The near-infrared cut filter according to claim 1, wherein the spectral transmittance characteristic of the near-infrared cut filter has a half-value wavelength on an ultraviolet side that is 405 nm to 350 nm, and a half-value wavelength on a near-infrared side that is 750 nm to 900 nm.

10. The near-infrared cut filter according to claim 1, wherein each of the high-refractive index films is made of titanium oxide or niobium oxide, and each of the low-refractive index films is made of silicon oxide.

11. The near-infrared cut filter according to claim 1, wherein a reflected color of the near-infrared cut filter is an achromatic color for incident light having an incident angle that is in a range of 0 degree to 80 degrees.

12. An imaging device, comprising:
a solid-state image sensing device; and
the near-infrared cut filter of claim 1 disposed on an imaging plane side of the solid-state image sensing device.

13. The imaging device according to claim 12, wherein the near-infrared cut filter is a cover glass positioned to protect the solid-state image sensing device from an external environment.

14. An electronic apparatus, comprising:
an apparatus main body; and
the imaging device of claim 12 having at least one portion housed inside the apparatus main body.

15. The electronic apparatus according to claim 14, wherein the electronic apparatus is a portable electronic apparatus.

16. The electronic apparatus according to claim 15, wherein the portable electronic apparatus is a mobile phone or a smartphone.

* * * * *